(12) United States Patent
Aurola

(10) Patent No.: US 8,288,837 B2
(45) Date of Patent: *Oct. 16, 2012

(54) SEMICONDUCTOR RADIATION DETECTOR OPTIMIZED FOR DETECTING VISIBLE LIGHT

(76) Inventor: Artto Aurola, Espoo (FI)

(*) Notice: Subject to any disclaimer, the term of this patent is extended or adjusted under 35 U.S.C. 154(b) by 1121 days.

This patent is subject to a terminal disclaimer.

(21) Appl. No.: 12/087,359

(22) PCT Filed: Feb. 17, 2006

(86) PCT No.: PCT/FI2006/000058
§ 371 (c)(1),
(2), (4) Date: Jul. 2, 2008

(87) PCT Pub. No.: WO2007/077287
PCT Pub. Date: Jul. 12, 2007

(65) Prior Publication Data
US 2008/0315265 A1      Dec. 25, 2008

(30) Foreign Application Priority Data
Jan. 5, 2006  (WO) .................. PCT/FI2006/000009

(51) Int. Cl.
*H01L 21/00* (2006.01)
(52) U.S. Cl. ....... 257/447; 257/88; 257/292; 250/214.1; 438/142
(58) Field of Classification Search .................... 257/88, 257/292, 447; 438/142; 250/214.1
See application file for complete search history.

(56) References Cited

U.S. PATENT DOCUMENTS

| 5,049,962 A | * | 9/1991 | Huang et al. .................. 257/463 |
| 5,165,457 A |   | 11/1992 | Olin et al. |
| 5,189,297 A | * | 2/1993 | Ahlgren ..................... 250/214.1 |

(Continued)

FOREIGN PATENT DOCUMENTS

JP          59-198756        11/1984

(Continued)

OTHER PUBLICATIONS

W. Neeser et al., "DEPFET—a pixel device with integrated amplification," Nuclear Instruments and Methods in Physics Research A 477 (2002), pp. 129-136, Elsevier Science B.V., Germany.

(Continued)

*Primary Examiner* — Fernando L Toledo
*Assistant Examiner* — John C Ingham
(74) *Attorney, Agent, or Firm* — Wood, Phillips, Katz, Clark & Mortimer

(57) ABSTRACT

A semiconductor radiation detector comprises a bulk layer of semiconductor material, and on a first surface of the bulk layer in the following order: a modified internal gate layer of semiconductor of second conductivity type, a barrier layer of semiconductor of first conductivity type and pixel dopings of semiconductor of the second conductivity type. The pixel dopings are adapted to be coupled to at least one pixel voltage in order to create pixels corresponding to pixel dopings. The device comprises a first conductivity type first contact. Said pixel voltage is defined as a potential difference between the pixel doping and the first contact. The bulk layer is of the first conductivity type. On a second surface of the bulk layer opposite to the first surface, there is nonconductive back side layer that would transport secondary charges outside the active area of the device or function as the radiation entry window.

34 Claims, 36 Drawing Sheets

U.S. PATENT DOCUMENTS

| | | | |
|---|---|---|---|
| 5,538,564 A * | 7/1996 | Kaschmitter | 136/255 |
| 5,598,016 A * | 1/1997 | Tanabe et al. | 257/229 |
| 6,169,319 B1 * | 1/2001 | Malinovich et al. | 257/447 |
| 7,816,653 B2 * | 10/2010 | Aurola | 250/370.14 |
| 2005/0167709 A1 * | 8/2005 | Augusto | 257/292 |
| 2005/0194653 A1 | 9/2005 | Hynecek et al. | |
| 2005/0221541 A1 * | 10/2005 | Metzler et al. | 438/142 |

FOREIGN PATENT DOCUMENTS

| | | |
|---|---|---|
| JP | 63220567 | 8/1988 |
| JP | 2000-31525 | 1/2000 |
| JP | 2002-294079 | 10/2002 |
| JP | 2005-12007 | 1/2005 |
| JP | 2005-191019 | 7/2005 |
| JP | 2007-297444 | 11/2007 |
| WO | WO 2005/074012 A2 | 8/2005 |

OTHER PUBLICATIONS

Patent Abstracts for JP 59-198756.

English Translation of Official Action Dated Jun. 26, 2012 from Japan Patent Office for counterpart Japan application.

* cited by examiner

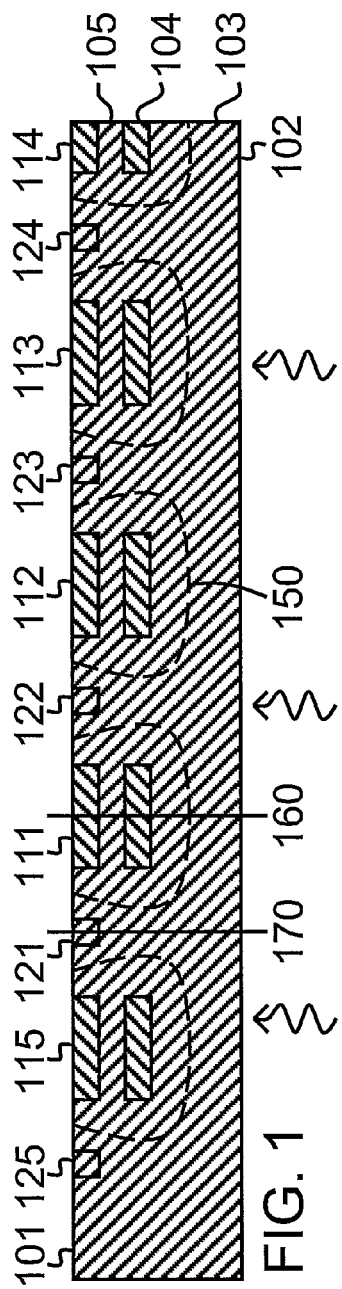
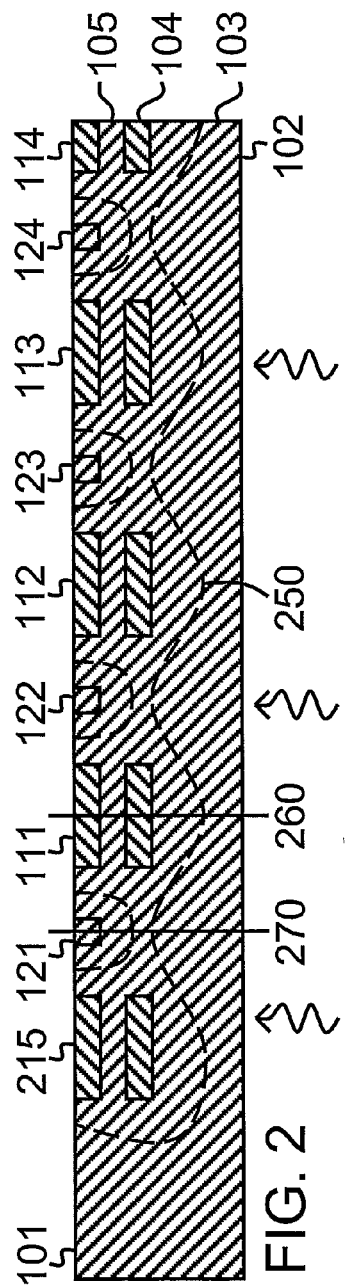
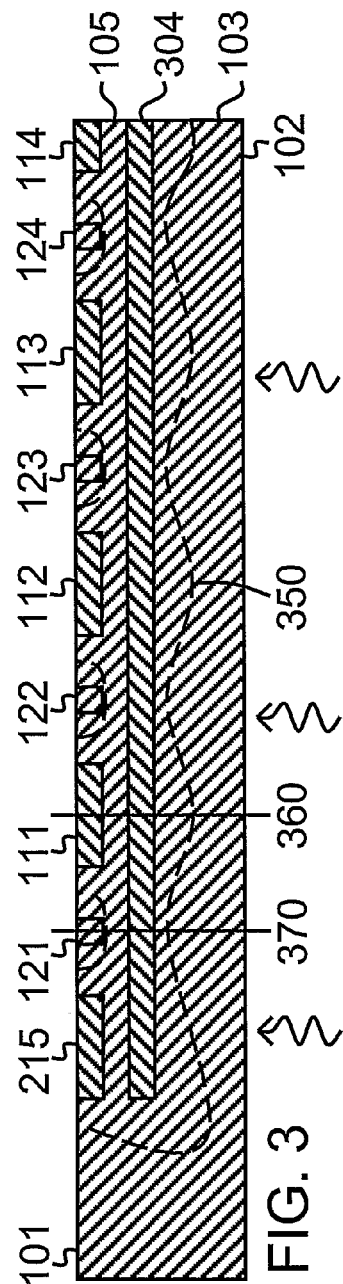
FIG. 1
FIG. 2
FIG. 3

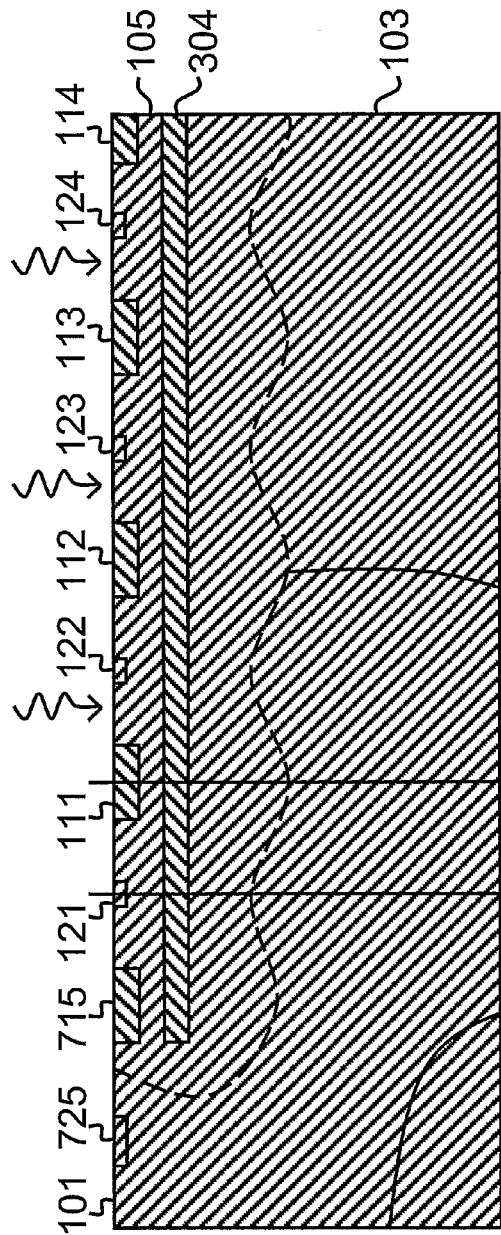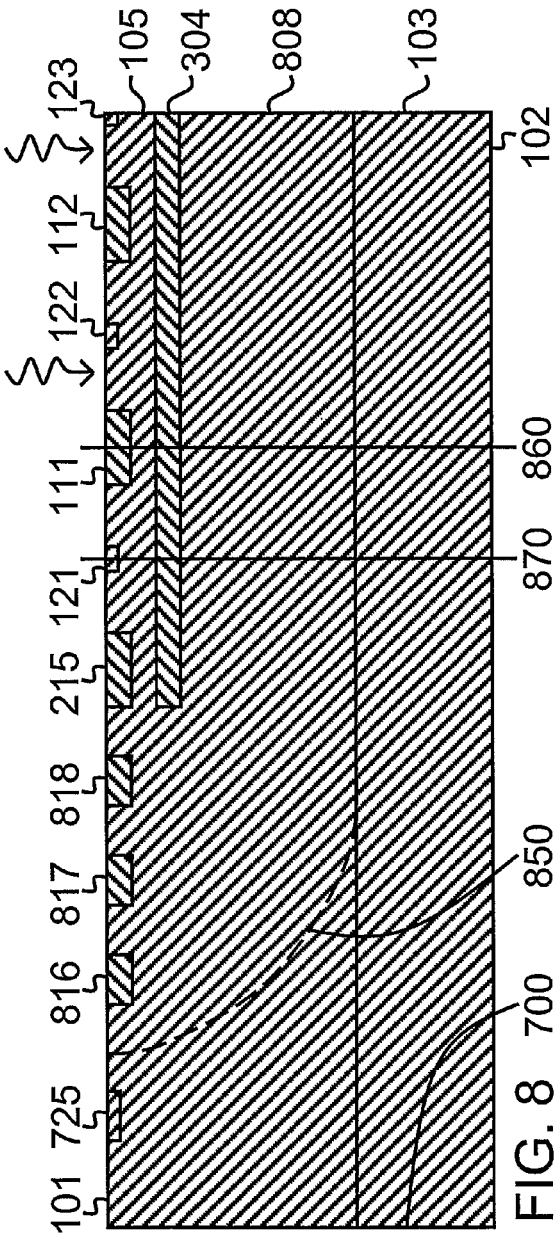

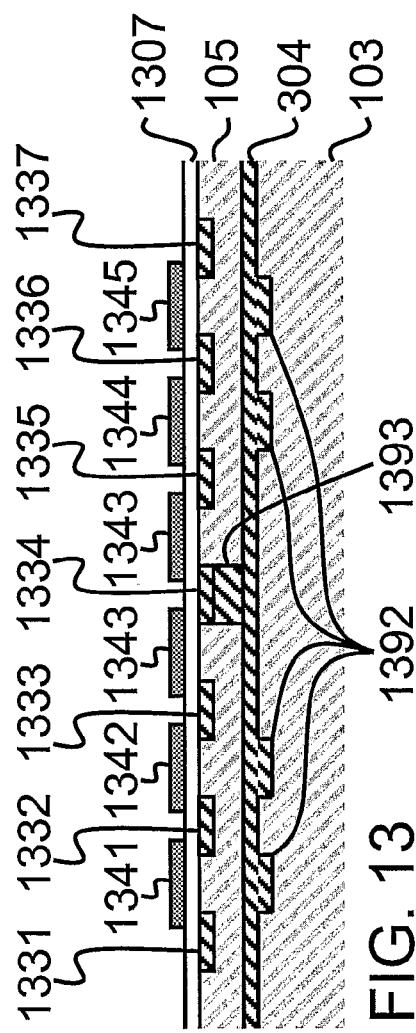
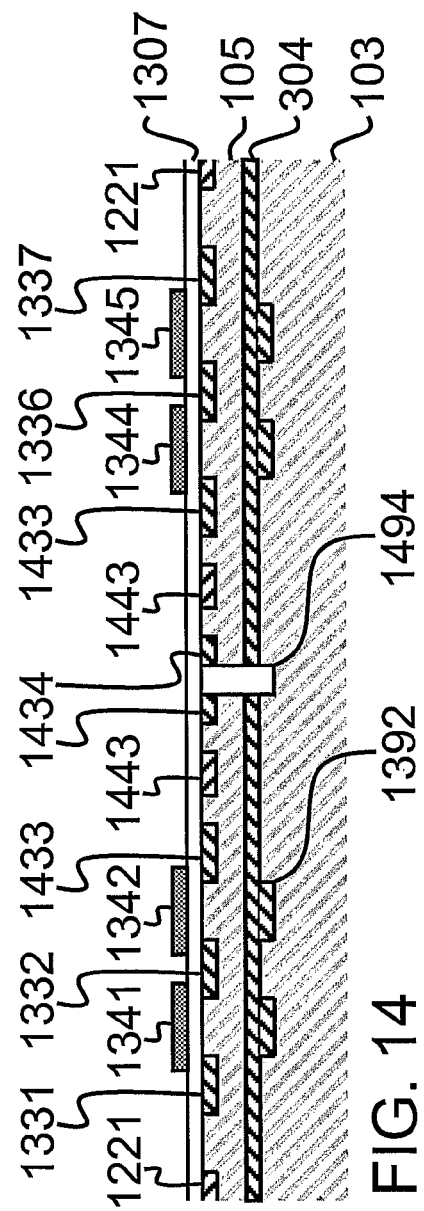

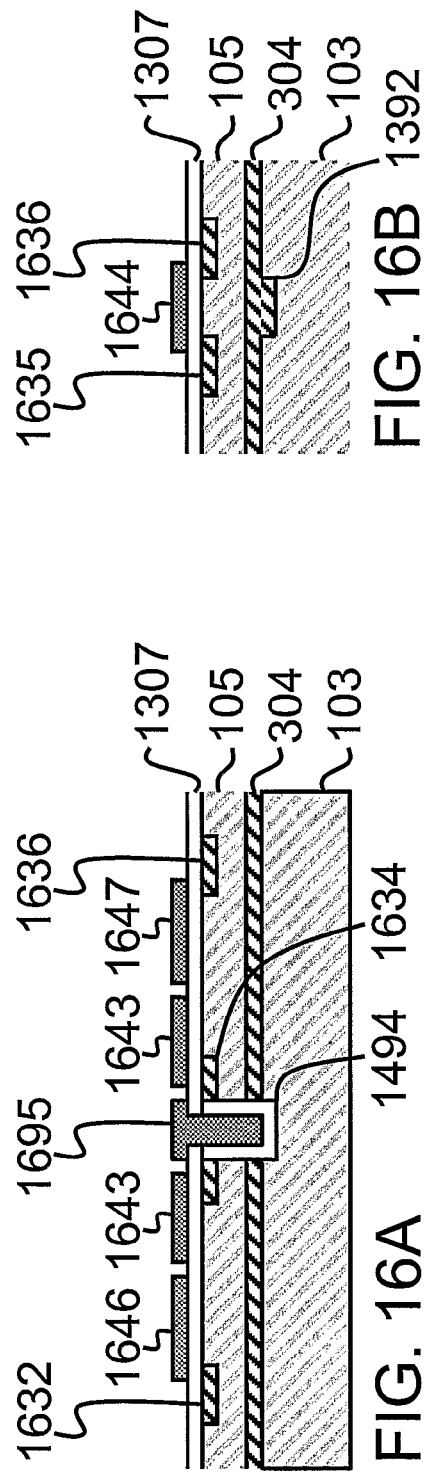

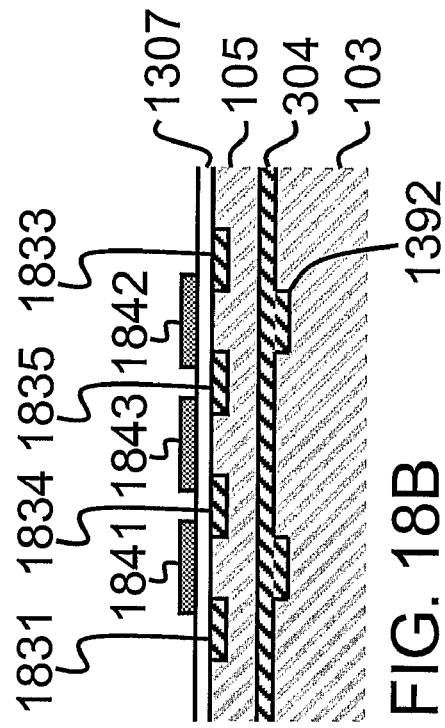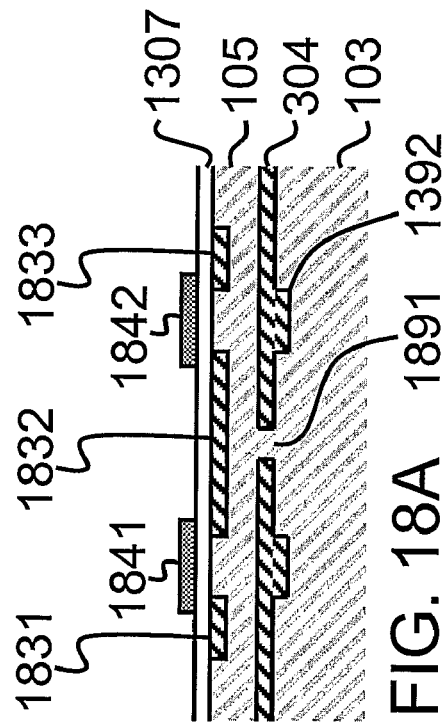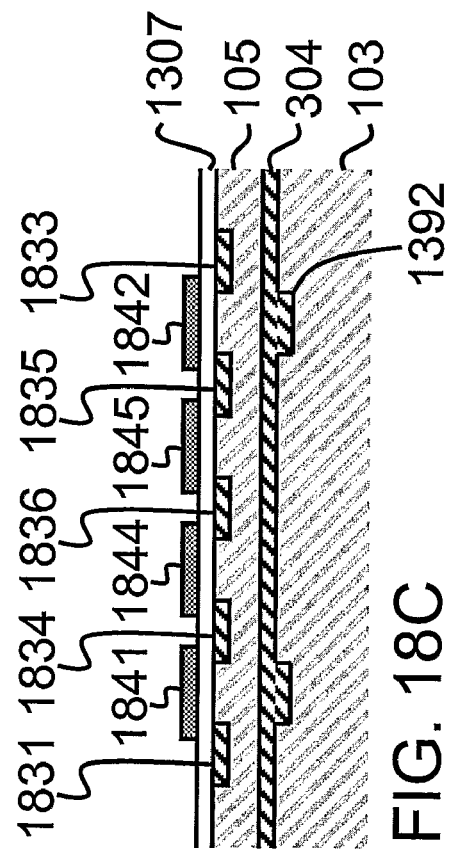

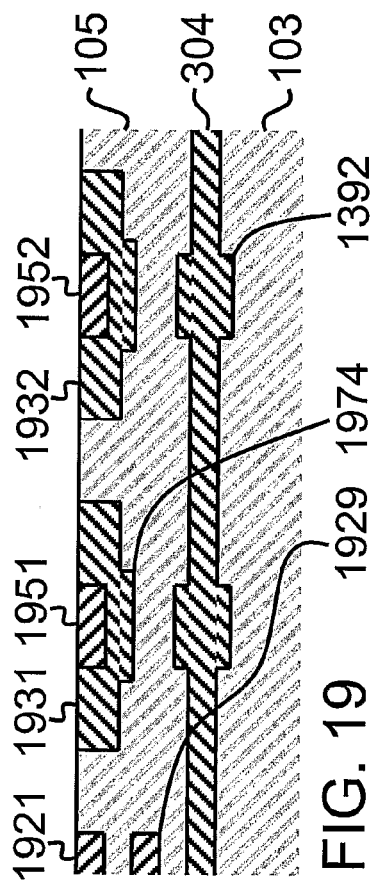
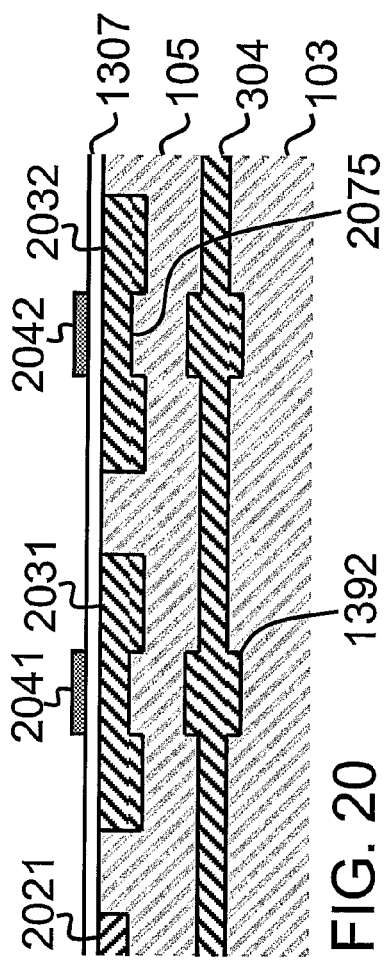
FIG. 19
FIG. 20

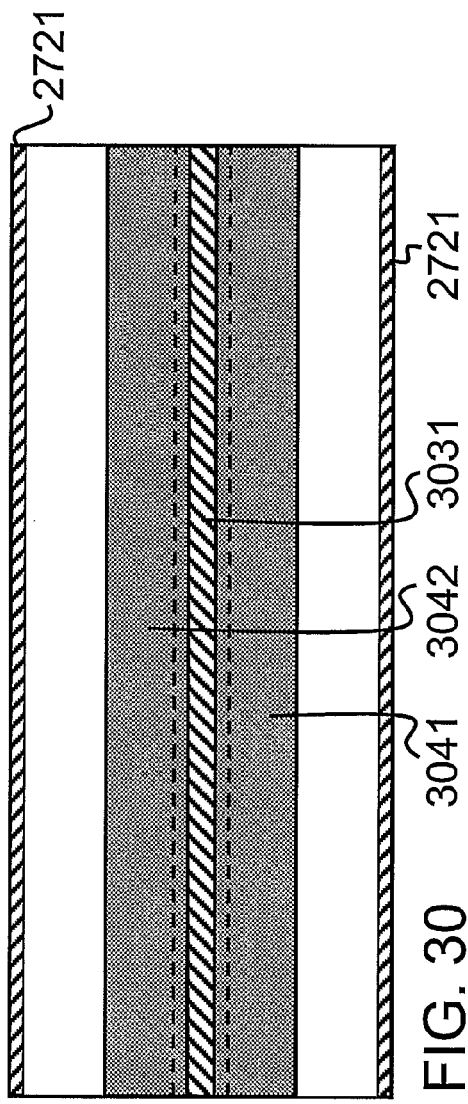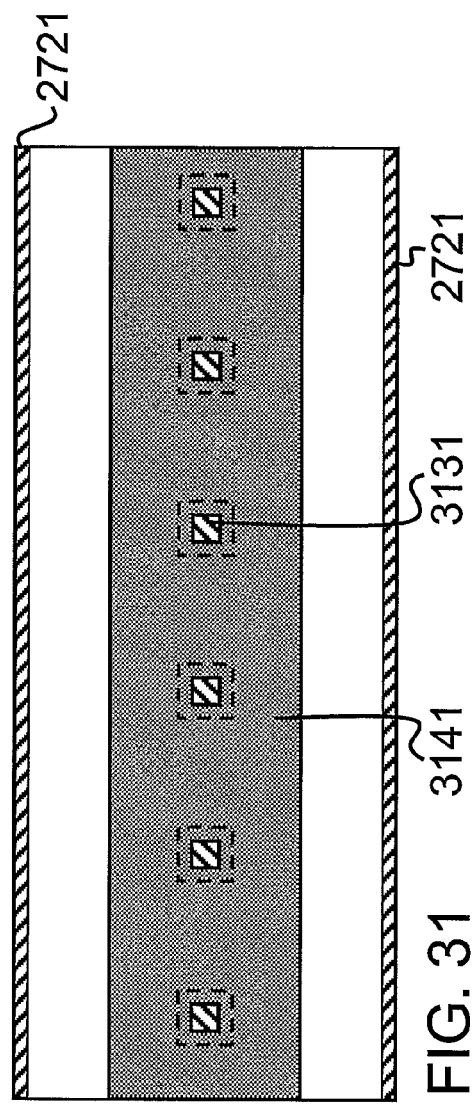

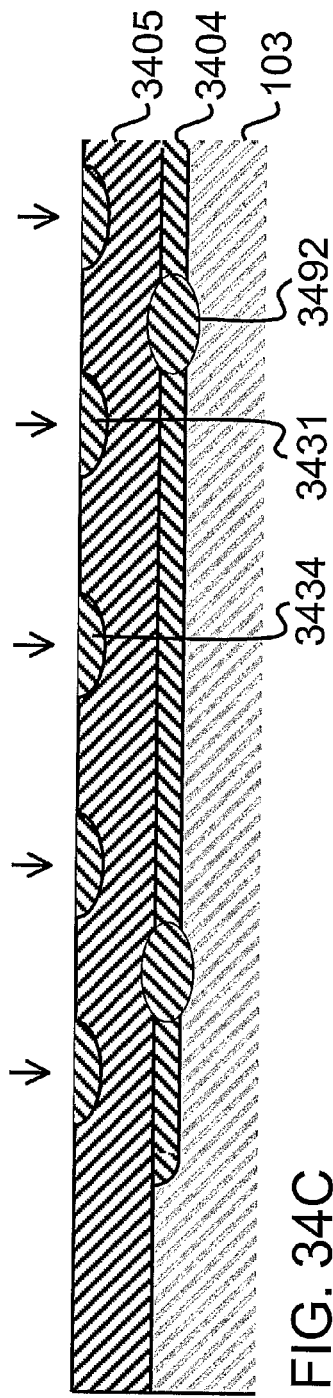
FIG. 34C
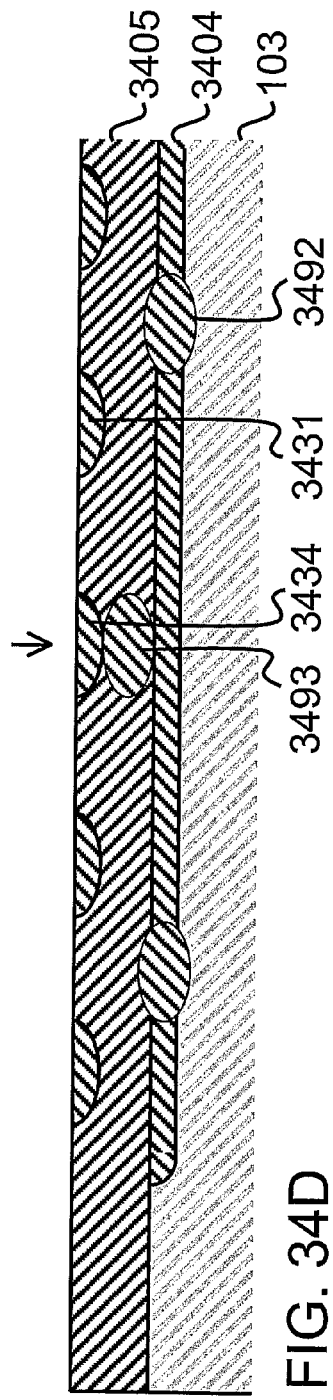
FIG. 34D
FIG. 35A, prior art
FIG. 35B, prior art

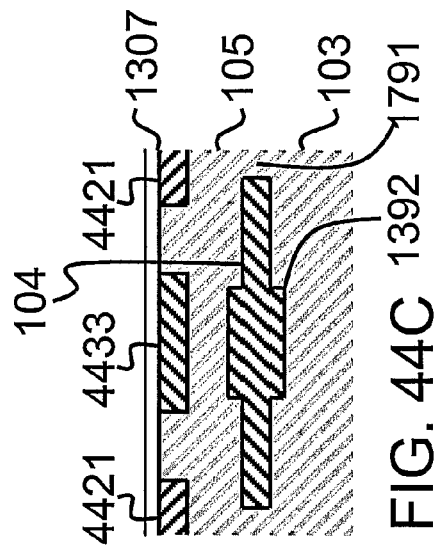
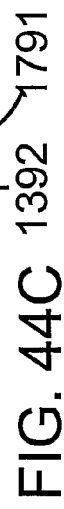
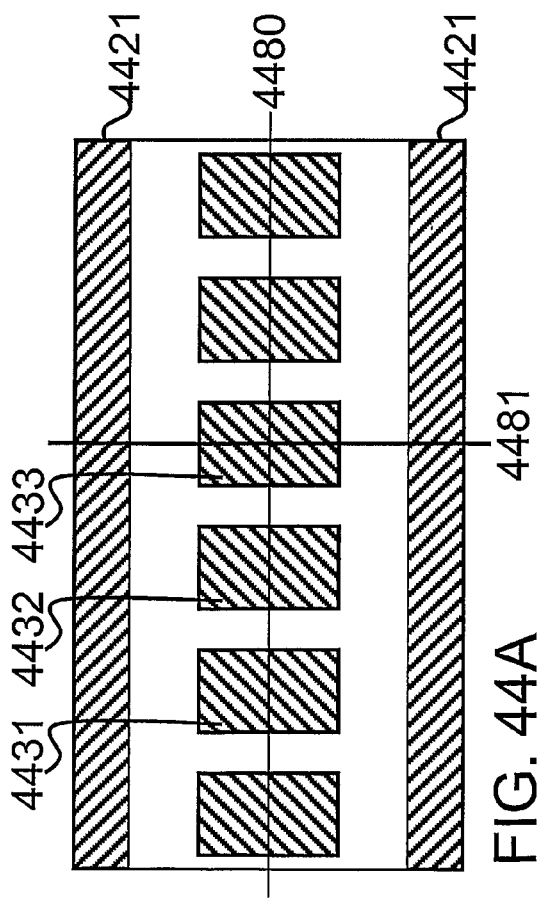
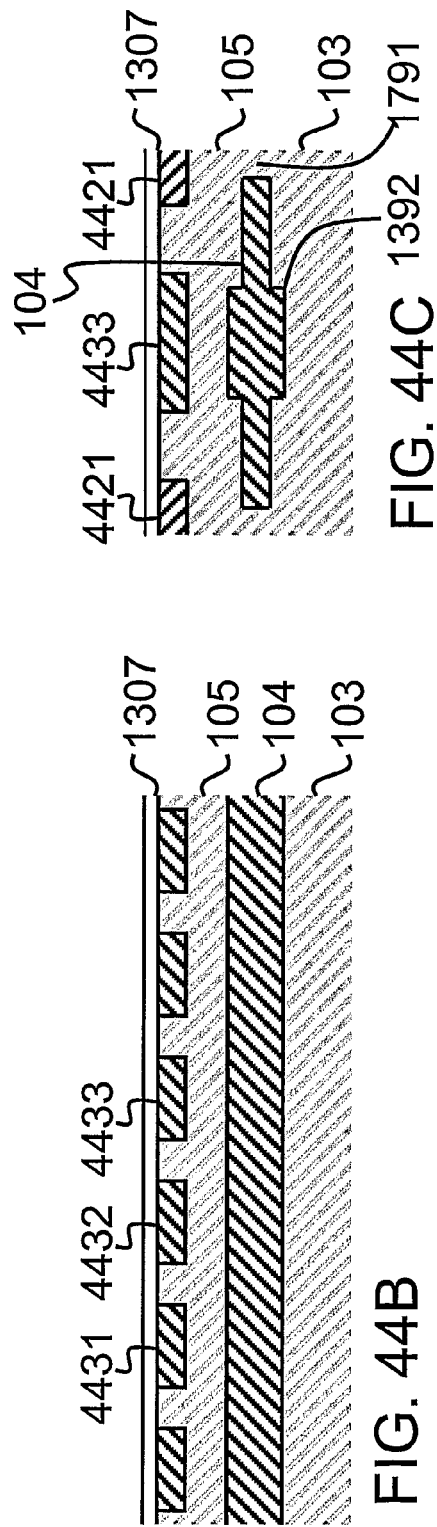
FIG. 44A
FIG. 44B
FIG. 44C

SEMICONDUCTOR RADIATION DETECTOR OPTIMIZED FOR DETECTING VISIBLE LIGHT

FIELD OF THE INVENTION

The invention is related to semiconductor radiation detectors and particularly to a semiconductor radiation detector having a modified internal gate.

BACKGROUND OF THE INVENTION

Radiation is converted to electron hole pairs in semiconductor material. In semiconductor radiation detectors the electron hole pairs are separated by an electric field. The charge type of the electron hole pair that is measured is referred to as signal charge and the opposite charge type is referred to as secondary charge.

Patent applications PCT/FI2004/000492 and PCT/FI2005/000359, which are incorporated herein by reference, disclose a semiconductor radiation detector having a modified internal gate (MIG). This detector is herein after referred to as the MIG detector. The MIG detector is back-illuminated and it has a thick fully depleted substrate and a thin conductive layer on the backside of the device. This conductive backside layer has three functions: when it is properly biased it enables full depletion of the thick substrate, it transports the secondary charges outside the active area of the device and it functions as a thin homogeneous radiation entry window. The MIG detector has many benefits. The surface generated charges can be separated from the signal charges, which provides a small dark current noise. The signal charge can be read non-destructively enabling the signal charge to be read multiple times which reduces the read noise. Back-illumination and the thin homogeneous radiation entry window enable the detection of shallow penetrating radiation like low energy X-rays and particles with a good energy resolution. The thick fully depleted substrate enables the detection of deeply penetrating radiation.

The substrate material of the MIG detector is preferably high resistive, i.e. almost intrinsic silicon and the thickness of the substrate is a few hundred micrometers. Such a MIG detector can be used for detecting particles, X-rays from low to medium energies (~100 eV-~10 keV) and photons from ultraviolet and blue light to near infrared radiation. Near infrared radiation is here referred to as radiation that can not be seen by the human eye and that has a wavelength below 1.1 µm which is the detection limit of silicon. Near infrared radiation which wavelength is close but below this limit has a very big attenuation depth in silicon, up to hundreds of micrometers. Due to back-illumination, due to the thick fully depleted substrate and due to the thin radiation entry window the MIG detector has high quantum efficiency from near infrared radiation to blue light. Due to the thick substrate also a phenomenon called fringing is eliminated. The fringing phenomenon is a problem in detectors having a thin substrate. In such detectors the near infrared radiation is reflected many times between the front and back surfaces of the detector before it is absorbed, causing unwanted interference patterns. Since the moonless night sky contains at least an order of magnitude more near infrared photons than visible photons and since the reflection coefficient of many materials is much higher for near infrared radiation than for visible light (for instance the reflectivity of foliage is three to six times higher) the MIG detector is very well applicable to low light detection in night vision devices.

The MIG detector does not, however, suite very well for the detection of visible light in silicon based portable consumer applications for the following reasons. The depletion of the thick substrate requires at least a few tens of volts. For a portable consumer device such a voltage is clearly too high and it results in too big power consumption. The high resistive silicon substrate is expensive and it is difficult to process, which increases the manufacturing cost. It is also difficult to contact the conductive back side layer reliably from the front side through the thick high resistive substrate, which would be important for mass production. A lot of bulk generation current is generated in the thick fully depleted substrate, which is likely to necessitate the use of cooling. In portable consumer applications the cooling of the detector is, however, not usually possible. The sharpness of the images is also somewhat degraded since visible light is absorbed on the back side of the detector and the signal charges have to drift a long way before they reach the front surface. For this reason also the use of colour filters on the back side of the device is problematic.

The attenuation depth of red light in silicon is not more than ten micrometers. For blue and green light the attenuation depth is even less. It is thus not necessary to have a thick substrate for visible light detection. Instead of the thick substrate one could use a thin (typically around 10 µm and less than 50 µm) substrate in a back thinned MIG detector. A thin device brakes, however, very easily and it is thus necessary to perform the back side processing at the end of the manufacturing process. There exist two possible methods to do this. In the first one the front side of the substrate is attached to a support substrate after which the back side of the detector is thinned. In the second one the back side of the detector is etched only below the active area containing the pixels and a thicker support area is left on the sides of the detector. In both of the methods it is required that the front side processing is finished before the back side is thinned. This fact complicates the manufacturing of the conducting back side layer. In order to process a very thin conductive back side layer enabling good quantum efficiency for blue light there exists two possible processes that are suitable for mass production. In the first method the conductive backside layer is done by implantation, which requires a high temperature annealing step. All materials that are used on the front side of the device, like the metal wirings, must have a higher melting point than the annealing temperature. This fact prohibits the use of many materials that are common in integrated circuits like aluminum. In the second method a thin layer is deposited on the back side of the device. A lot of dark current is, however, created at the interface between the conductive layer and the substrate and in order to suppress this current cooling is required.

There exists also an inherent problem related to the conductive back side layer in case the MIG detector is used for visible light detection. In order to detect badly illuminated areas of an image properly the size of the chip has to be large and a large optical aperture has to be used. In order to have also good quantum efficiency for the blue light the conductive back side layer has to be very thin. If the image contains also very bright areas, a lot of secondary charge current will be running in the conductive back side layer. The large current running in the conductive backside layer, and the small thickness and the large area of the conductive back side layer result in, however, a large resistive voltage drop in the conductive back side layer. This resistive voltage drop degrades the image quality and may lead to malfunction of the detector, especially if the detector is very thin.

Another problem in the MIG detector is that a relatively high voltage is required to clear the signal charge in the MIG especially if a high dynamic range is desired, i.e. if a large signal charge capacity of the MIG is desired. Yet another problem is that in some cases the isolation of the surface generated and signal charges should be improved in MIG detectors.

BRIEF DESCRIPTION OF THE INVENTION

An objective of the present invention is to provide a semiconductor radiation detector comprising the modified internal gate, in which the problems created by the conducting backside layer are removed. Another objective of the invention is to provide a structure for a semiconductor radiation detector comprising the modified internal gate, by which the signal charge can be cleared using only a small voltage. Yet another objective of the invention is to provide means to enhance the separation of the surface generated charges and signal charges.

The objectives of the invention are achieved with a semiconductor radiation detector, which comprises a bulk layer of semiconductor material, and further comprises on the first surface of the bulk layer in the following order: a modified internal gate layer of semiconductor of second conductivity type, a barrier layer of semiconductor of first conductivity type, and pixel dopings of semiconductor of the second conductivity type, adapted to be coupled to at least one pixel voltage in order to create pixels corresponding to pixel dopings. The device is characterised in that it comprises a first conductivity type first contact, so that said pixel voltage is a potential difference between the pixel doping and the first contact, and the bulk layer is of first type, and the device does not comprise, on a second surface of the bulk layer opposite to the first surface, a conductive back side layer that would transport secondary charges outside the active area of the device and that would function as a radiation entry window.

The invention is based on the idea of removing the conducting back side layer from the MIG detector. It is realised that the secondary charges generated in the bulk layer can be collected inside the active area by channel stops instead of using a conductive backside layer for transporting them outside the active area. The collection of the secondary charges from the bulk layer inside the active area can be further improved by gaps in the MIG layer and by trench structures that are properly filled. It is also realised that a novel MIG detector can be front illuminated. The front illuminated novel MIG detector suffers, however, from poor blue response because of the following fact. The barrier layer forms a barrier for the signal charges between the MIG layer and the surface of the device. Blue light is absorbed mainly between this barrier and the front surface of the detector and thus a large portion of the signal charges generated by blue light is collected by the pixel doping and not by the MIG. By realising that such a barrier does not exist below the channel stops and that the channel stop area can be used as a radiation entry window and by further realising that the channel stops can be very thin and that the channel stop area can be very large in size, the blue response of a front illuminated device can be improved significantly. The large area of the channel stops reduces, however, the signal charge transporting potential gradient in the MIG layer under the channel stops. It is further realised that this potential gradient transporting the signal charges can be improved by a structured, i.e. by a discontinuous MIG layer. Another possibility is to alter the doping concentration in the barrier layer, in the MIG layer or in the bulk layer next to the MIG layer in order to improve the potential gradient transporting the signal charges. In the front illuminated detector the secondary charges that are generated in the bulk can be collected by the channel stops inside the active area, and/or by a substrate contact situated outside the active area on the front side of the detector, and/or by a substrate contact situated on the edge of the detector chip or on the backside of the detector chip.

The signal charges can be cleared using only a small voltage by a structure where there is in the barrier layer of the first conductivity type a doped region of the second conductivity type or a local reduction of the barrier layer net doping between the modified internal gate layer of second conductivity type and a pixel doping of second conductivity type or by a structure where there is a trench between the MIG layer doping and the front surface of the detector, and where a gate controls the flow of signal charges from the modified internal gate layer to the pixel doping or to the front surface of the detector through the doped region of second conductivity type, through the trench structure or through the local reduction of the barrier layer doping.

The separation of the signal charges and of the surface generated charges can be improved for instance by a doped region of the second conductivity type situated between the barrier layer and the front surface of the detector or by a gated structure.

BRIEF DESCRIPTION OF THE DRAWINGS

FIG. 1 illustrates an embodiment of the invention,
FIG. 2 illustrates an alternative biasing scheme of the semiconductor radiation detector presented in FIG. 1,
FIG. 3 illustrates another embodiment of the invention,
FIG. 7 illustrates yet another embodiment of the invention,
FIG. 8 illustrates the semiconductor radiation detector of FIG. 7 using guard structures,
FIG. 13 illustrates a cross-section of the detector presented in FIG. 11,
FIG. 14 illustrates a cross-section of the detector presented in FIG. 12,
FIG. 16A illustrates a cross-section of the detector presented in FIG. 15,
FIG. 16B illustrates a cross-section of the detector presented in FIG. 15,
FIG. 16C illustrates a cross-section of the detector presented in FIG. 15,
FIG. 16D illustrates a cross-section of the detector presented in FIG. 15,
FIG. 18A illustrates an embodiment of the invention,
FIG. 18B illustrates an embodiment of the invention,
FIG. 18C illustrates an embodiment of the invention,
FIG. 19 illustrates an embodiment of the invention,
FIG. 20 illustrates an embodiment of the invention,
FIG. 30 illustrates a gate signal modified internal gate detector,
FIG. 31 illustrates another embodiment of the gate signal modified internal gate detector,
FIG. 34C illustrates one process step of one possible detector manufacturing process,
FIG. 34D illustrates one process step of one possible detector manufacturing process,
FIG. 35A illustrates a prior art strip detector,
FIG. 35B illustrates a prior art strip detector,
FIG. 44A illustrates an embodiment of the invention,
FIG. 44B illustrates an embodiment of the invention,
FIG. 44C illustrates an embodiment of the invention.

DETAILED DESCRIPTION OF THE INVENTION

Figure 4:
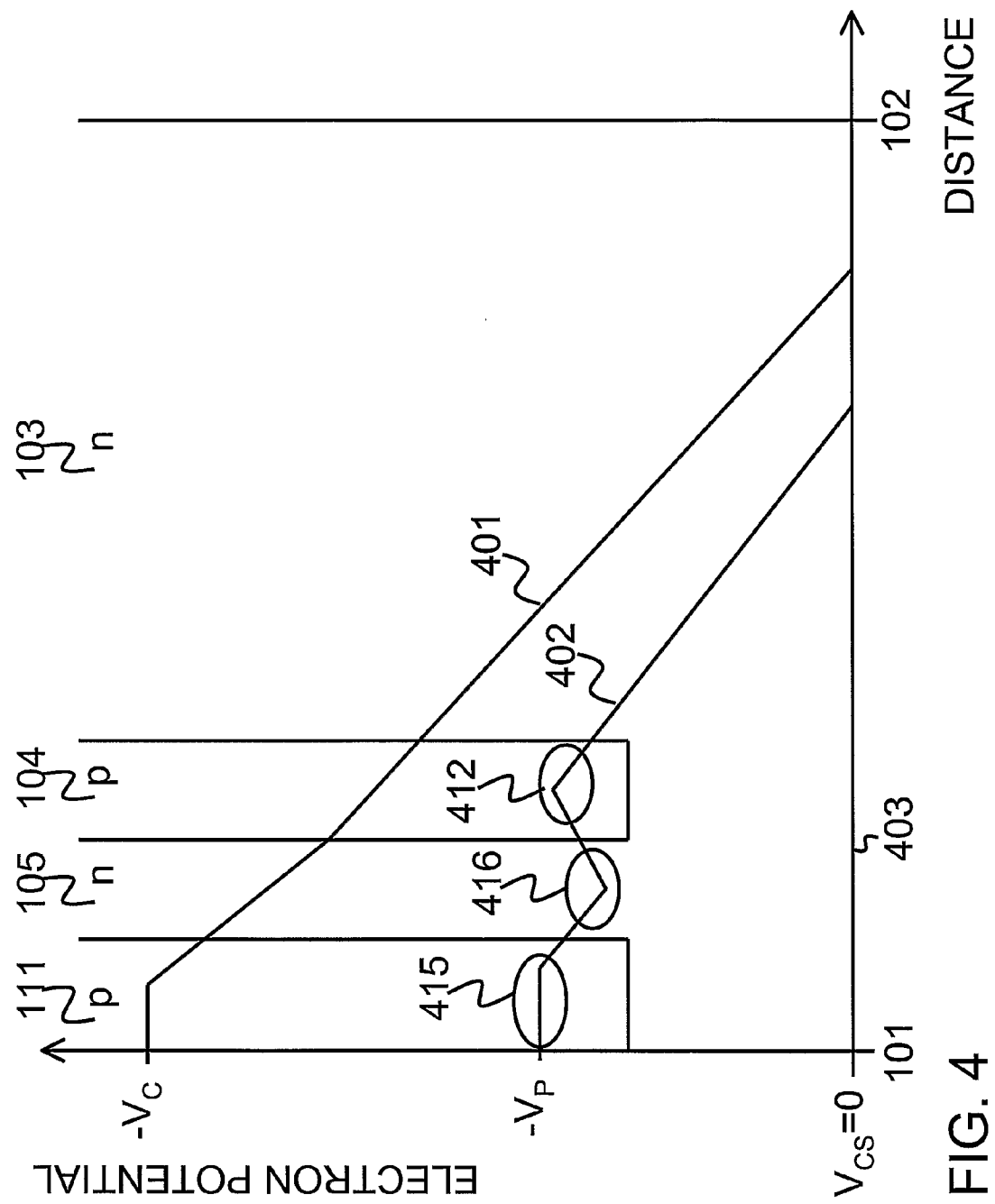
FIG. 4 illustrates electron potentials of the detector presented in FIG. 1, which uses holes as the signal charges.

FIG. 1 is a schematic cross section of a radiation detector, which is preferably thin and back illuminated. The detector has a front surface 101 which is upwards in the drawing. The back surface 102 of the detector, through which radiation enters the detector, is downwards in the drawing. On the back surface there may be an optional antireflection or scintillator coating. The bulk layer 103 of the detector is made of semiconductor material of a first conductivity type. The first and second conductivity types or vice versa refer here to positively and negatively doped semiconductors, with an excess of positive and negative charges respectively. On the front side of the detector from the back surface towards the front surface there is first a layer 104 of the second conductivity type, which is in the following referred to as the modified internal gate (MIG) layer. In the device of FIG. 1 there are gaps in the MIG layer. In front of the MIG layer 104 there is again a layer 105 of the first conductivity type, designated here as the barrier layer. On top of the layer 105 can be protecting insulation layers and conductor layers forming wirings, gates, capacitors and etc.

Patterned, preferably pixel-like implantations 111, 112, 113, 114, 115 having the second conductivity type, are made in the barrier layer 105 on the front surface of the detector and are later referred to as pixel dopings. Biased channel stop dopings 121, 122, 123, 124, 125 of first conductivity type are placed between or next to the pixels. The dashed line 150 represents the border of the depletion region when a bias voltage $V_P$ is connected between the pixel dopings and the channel stop dopings. In the embodiment of FIG. 1 the depletion regions of individual pixels are not united and the bulk layer is thus in the same potential than the channel stop dopings. The biased channel stop dopings collect all the secondary charges generated inside the semiconductor detector including the secondary charges generated inside the bulk layer, i.e. secondary charges are collected inside the active area which contains the pixels and it is not necessary to transport the secondary charges outside the active area. For this reason a conductive backside layer is not required.

The cut line 160 is perpendicular to the front and back surface and it penetrates the pixel doping. The cut line 170 is also perpendicular to the front and back surface and it penetrates the channel stop doping. The electron potential curves on the cut lines 160 and 170 corresponding to the case where the first conductivity type is n type and second conductivity type is p type are presented in FIG. 4. The electron potential curve 403 on the cut line 170 is a straight horizontal line corresponding to the distance axis. The straight horizontal parts of the potential energy curves correspond to neutral areas and the sloping areas correspond to depleted areas. The electron potential curve 402 corresponds to the cut line 160 and represents the case when the potential difference between the channel stop doping and the pixel doping is $V_P$. In side the MIG layer there is formed a three dimensional (3D) potential energy minimum 412 for holes which are in this case the signal charges. The amount of holes in this 3D potential energy minimum can be detected as a decrease in the effective channel width of a field effect transistor (FET) or as a decrease in the effective base width in a bipolar junction transistor (BJT). In FIG. 4 this corresponds to the decreasing of the width 415. The location 416 inside the barrier layer is a 3D saddle point for both electrons and holes. The electron potential curve 401 on the cut line 160 corresponds to the case when a clear voltage $V_C$ is connected between the channel stop dopings and the pixel dopings. In this case the 3D potential energy minimum 412 for holes vanishes and the signal charge holes are collected by the pixel dopings.

Figure 5:
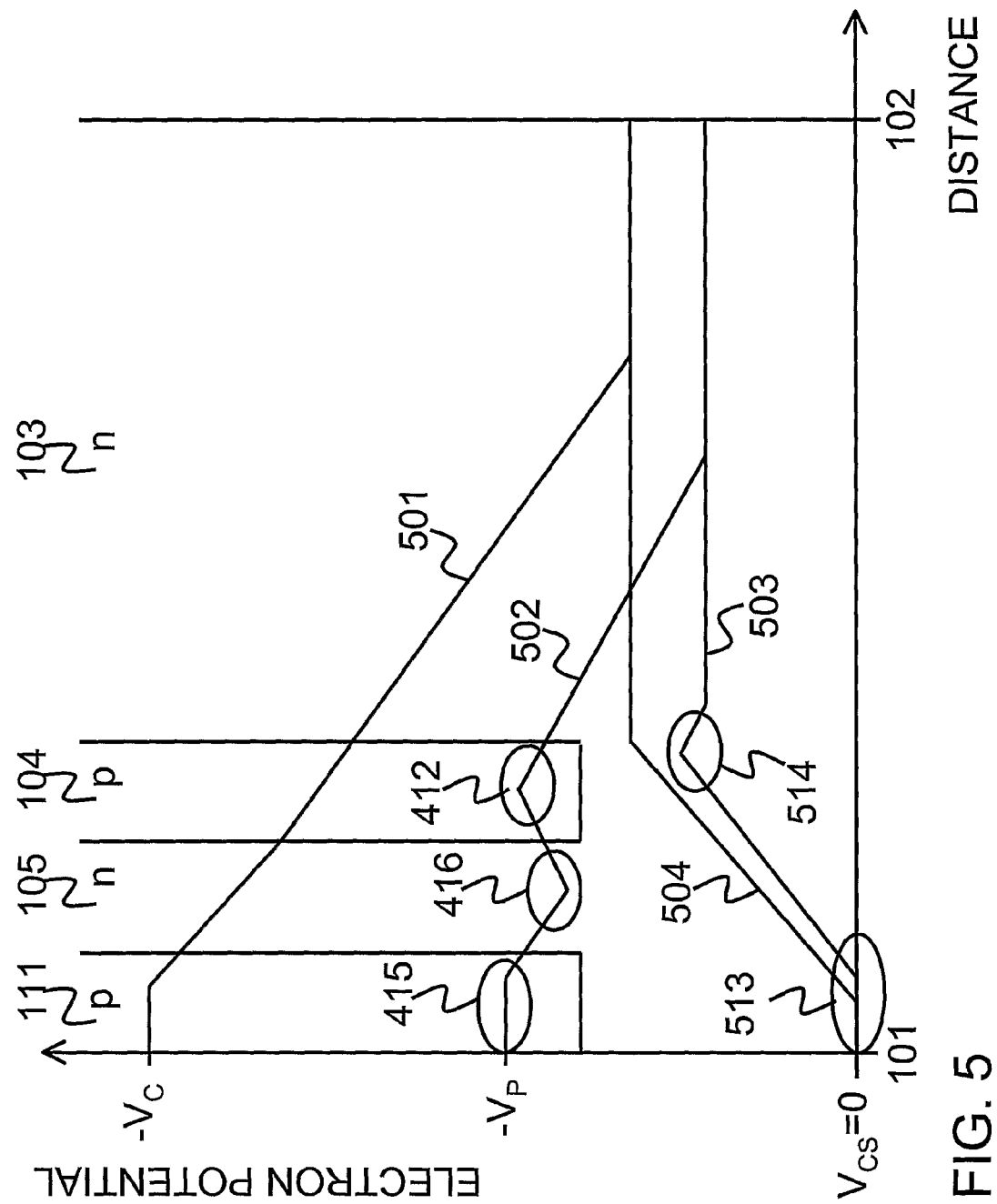
FIG. 5 illustrates electron potentials of the detector presented in FIG. 2, which uses holes as the signal charges.

FIG. 2 is a schematic cross section of a preferably thin back-illuminated semiconductor radiation detector having gaps in the MIG layer like in the device of FIG. 1. In this case, however, the bias voltage between the channel stop dopings and the pixel dopings is so high that there is only one single united depletion region 250. The pixel doping 215 is a guard ring surrounding the active area. The electron potential curves on the cut lines 260 and 270 are shown in FIG. 5. When the potential difference between the channel stop doping and the pixel doping is $V_P$ the electron potential curve 502 corresponds to the cut line 260 and the electron potential curve 503 corresponds to the cut line 270. When the potential difference between the channel stop doping and the pixel doping is $V_C$ the electron potential curve 501 corresponds to the cut line 260 and the electron potential curve 504 corresponds to the cut line 270. The neutral area 513 in the curves 503 and 504 corresponds to the channel stops. The neutral area on the right next to the back side of the device in the electron potential energy curves 501-504 corresponds to the neutral bulk layer which is floating. When the potential difference between the channel stop dopings and the pixel dopings is $V_P$, i.e. during the signal charge integration period, there exists in the curve 503 a potential energy barrier 514 for the secondary charge electrons that are collected by the bulk layer. When the potential difference between the channel stop dopings and the pixel dopings is $V_C$ there exists no potential energy barrier in the curve 504 and the secondary charges that are collected in the bulk layer during the signal charge integration period can flow freely to the channel stop dopings.

Figure 6:
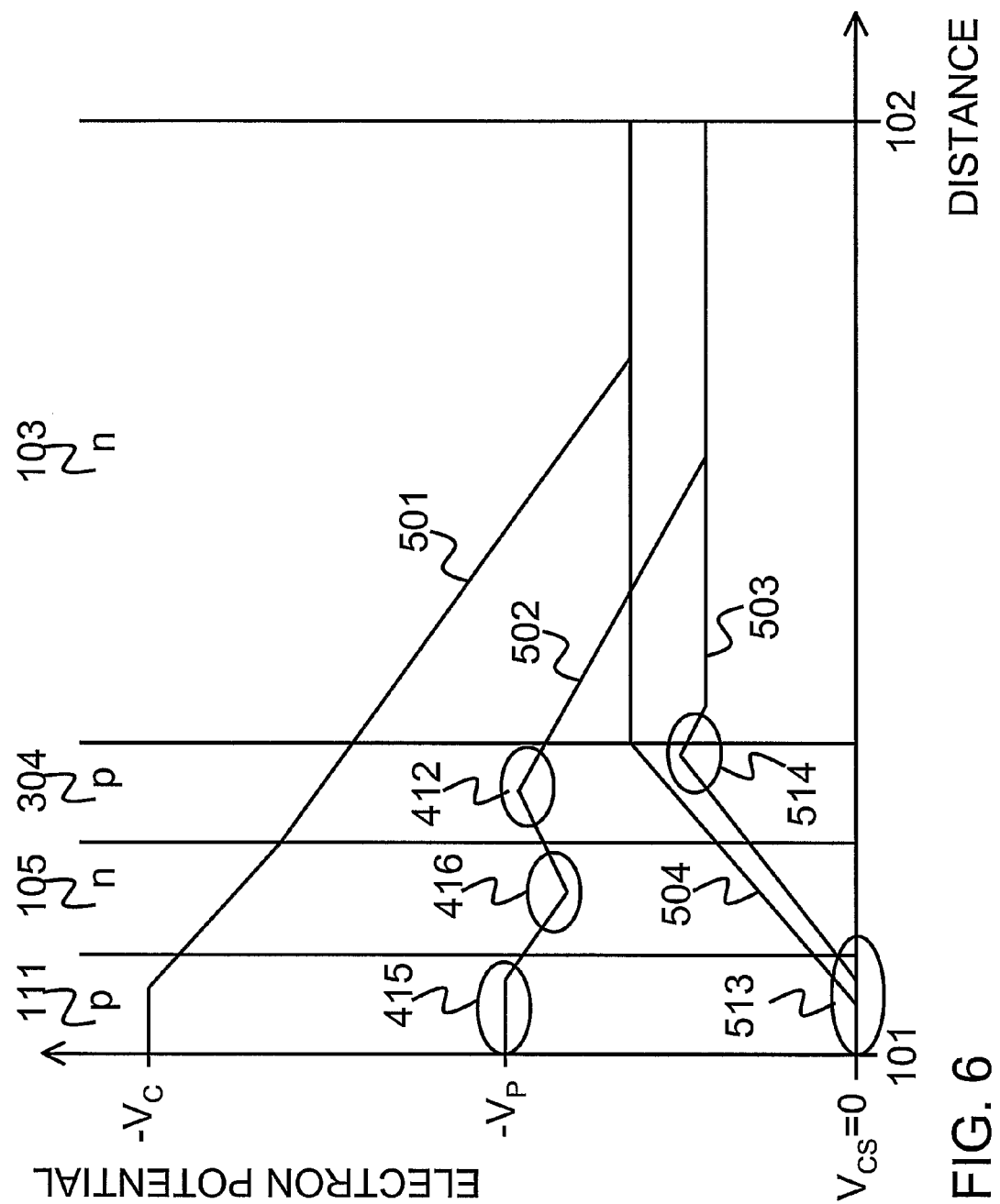
FIG. 6 illustrates electron potentials of the detector presented in FIG. 3, which uses holes as the signal charges.

FIG. 3 is a schematic cross section of a preferably thin back-illuminated semiconductor radiation detector having a continuous MIG layer 304. The dashed line 350 is the depletion region border. The bulk layer is floating in this detector arrangement just like in the detector of FIG. 2. The operation principle of the detector of FIG. 3 is presented in FIG. 6 and it corresponds to the operation principle of the detector of FIG. 2.

The devices in FIGS. 1-3 are preferably thin back illuminated detectors. In thin detectors the near infrared light should be filtered away in order to remove the fringing phenomenon. The detectors of FIGS. 1-3 can also be front illuminated. In this case the bulk layer is preferably several hundreds of micrometers thick, but the depletion region on the front side of the detector is only few micrometers thick. Due to the thick bulk layer it is not necessary to filter the near infrared radiation. The detectors in FIGS. 1-3 can also have additional layers and structures like antireflection coatings, colour filters, micro lenses, scintillator layers etc. One should note that in the front illuminated case possible material layers on the backside of the bulk layer are not essential to the application and that in the back illuminated case possible material layers on the front side of the device are not essential to the application. In the detectors of FIGS. 1-3 the secondary charges are collected inside the active area by the channel stop dopings, i.e. no conducting back-side layer is needed. The difficulties associated to the manufacturing of the thin conductive back-side layer on the back side of a thin detector and to the operation of such a detector are thus avoided.

FIG. 7 illustrates a front illuminated embodiment of the invention where part of the secondary charges is collected by the channel stop dopings and part is collected by a first conductivity type doping 725 functioning as the contact to the bulk layer. This contact 725 is on the front side of the detector but it could also be on the back surface of the detector or on the detector chip edge 700. If the doping 715 forms a pixel, the channel stop dopings are preferably at the same potential than the contact 725. The operation principle of such detector is presented in FIG. 9. The depletion region boundary 750 is also depicted in FIG. 7.

Figure 9:
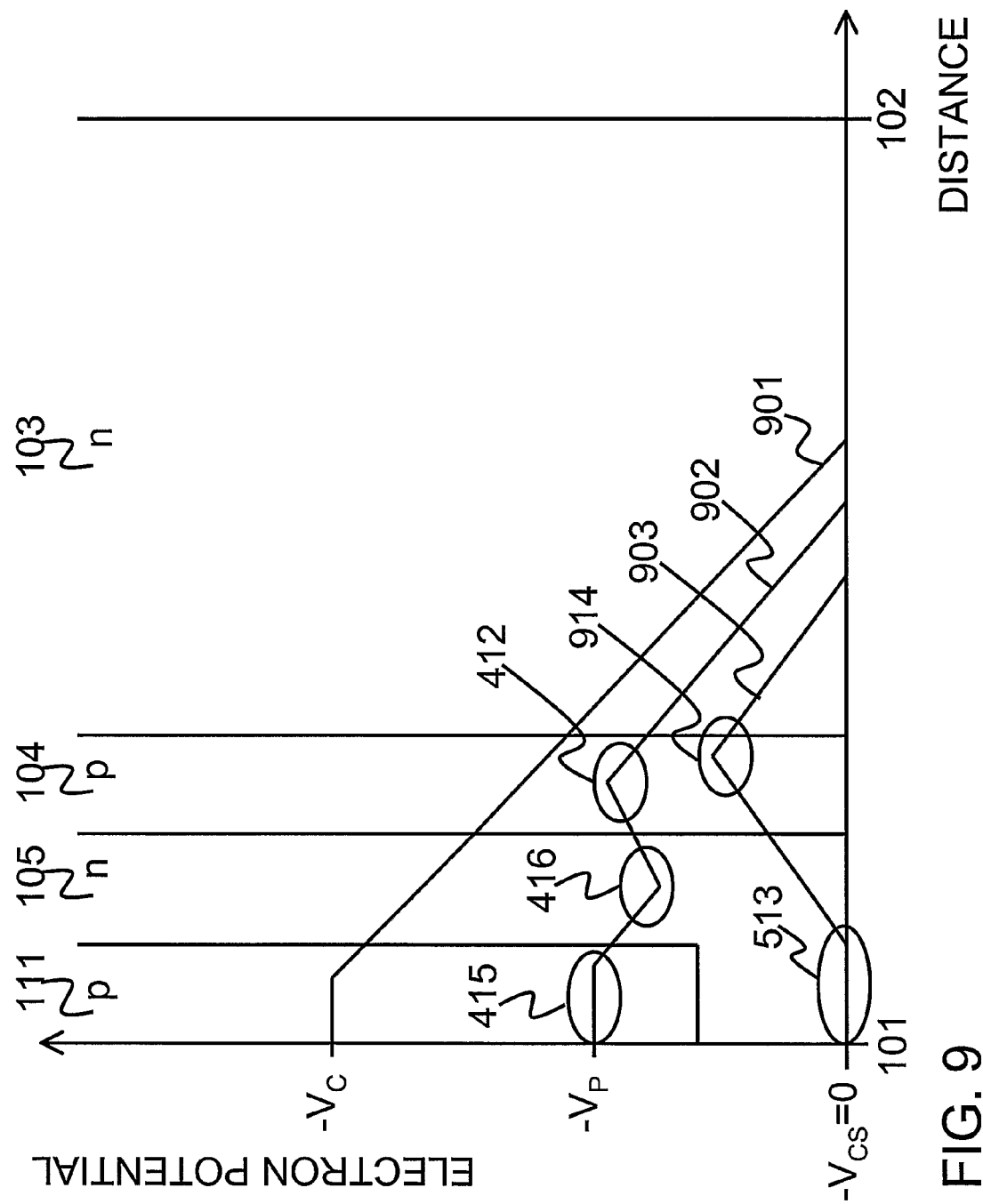
FIG. 9 illustrates electron potentials of the detector presented in FIG. 7, which uses holes as the signal charges.
Figure 10:
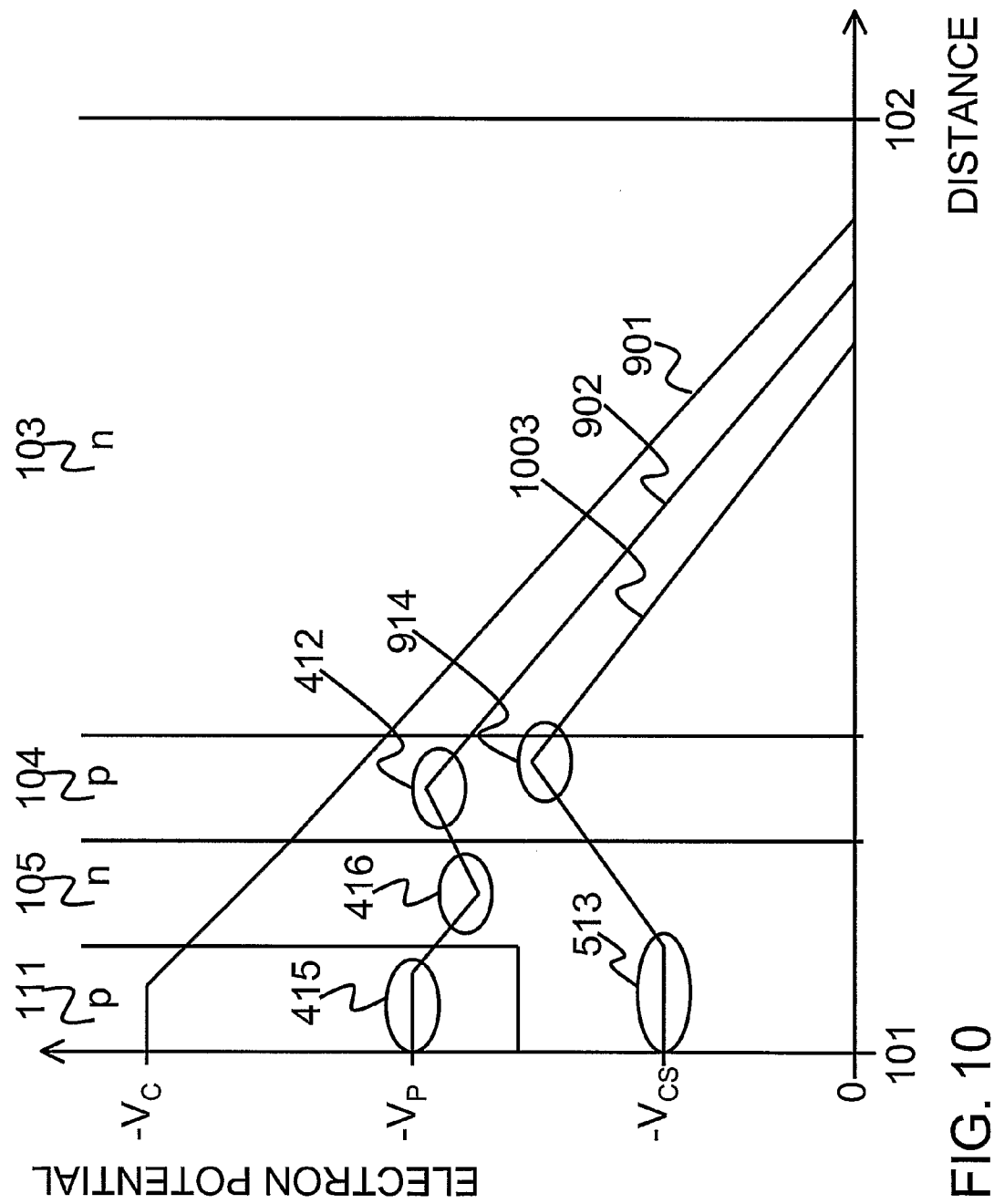
FIG. 10 illustrates electron potentials of the detector presented in FIG. 8, which uses holes as the signal charges.

FIG. 9 illustrates the situation when the first conductivity type is n type and the second conductivity type is p type. The curves 901 and 902 of FIG. 9 represent the electron potential energies on the cut line 760 which penetrates the pixel doping. The curve 901 corresponds to the situation when the pixel doping 111 is connected to the potential $V_P$ and the curve 902 corresponds to the situation when the pixel doping 111 is connected to the clear voltage $V_C$. The curve 903 represents the electron potential energy on the cut line 770. The 3D saddle point 914 for both electrons and holes forms a barrier for the secondary charge electrons. Part of the secondary charges is thus collected by the contact 725. If the doping 715 forms a guard ring surrounding the active area, the channel stop dopings and the bulk layer contact 725 can be at a different potential. This situation is presented by FIG. 10. The curve 1003 in FIG. 10 represents the electron potential energy on the cut line 770. The neutral bulk layer and the channel stops are in this case at different potentials, i.e. the neutral bulk layer is at zero potential and the channel stops are at the potential $V_{CS}$.

FIG. 8 represents another front illuminated embodiment of the invention. In this detector additional guard rings 816, 817 and 818 surround the innermost guard ring 215. No trench structures are needed in these guard rings due to the structured MIG layer. The layer 808 is an optional semiconductor layer of first conductivity type. The layer 808 has preferably a much higher resistivity than the bulk layer and it is preferably manufactured by epitaxial growth. The layer 808 may also be a deep well in which case it could be structured. The depletion region border 850 is also depicted in FIG. 8. If the optional layer 808 is not used the operation principle of the detector of FIG. 8 corresponds exactly to FIG. 10, i.e. the electron potential energy curves 901 and 902 correspond to the cut line 860 and the electron potential energy curve 1003 corresponds to the cut line 870. If the optional layer 808 is used the only difference to FIG. 10 is that the potential curves 901, 902 and 1003 terminate essentially at the interface of the layer 808 and the low resistive substrate. The optional layer 808 is preferably made of first conductivity type semiconductor material but it could also be made of second conductivity type semiconductor material. This would, however, necessitate a process where deep trenches are etched through such optional layer in order to avoid high leakage current arising from the detector chip edge.

One should note that the channel stops in the detectors of FIGS. 7 and 8 could be floating meaning that the secondary current would run from the channel stops over a potential barrier formed in the MIG layer to the bulk layer where it would be collected by the bulk layer contact 725. In case the channel stops are floating, the semiconductor material is silicon, silicon dioxide is used as isolator material and the first conductivity type is n type, no channel stop dopings are required (hereinafter silicon dioxide is referred to as oxide). In this case the positive oxide charge results in an accumulation layer of electrons at the silicon-oxide interface. This two dimensional (2D) electron gas layer functions as a channel stop. A 2D electron or hole gas layer can be formed also artificially at the semiconductor isolator interface by the use of a suitably biased MOS structure. In this case the 2D charge gas layer and the MOS structure form the channel stop. The channel stop area can thus be formed of the 2D charge gas layer or of the channel stop doping or of both of them. The detectors presented in FIGS. 7 and 8 can also have gaps in the MIG layer just like the detectors in FIGS. 1 and 2. If the channel stops and the bulk layer are biased at different potentials the gaps in the MIG layer must be such that no current is running between the bulk layer and the channel stops. If the channel stops are not biased at different potentials the gaps in the MIG layer can be arbitrarily wide. In this case the channel stops are either floating or at the same potential than the bulk layer.

It is important to note that FIG. 7-10 are not to scale since the bulk layer is in reality much thicker than presented in the picture, i.e. the bulk layer is preferably many hundreds of micrometers thick. The bulk layer has preferably a low resistivity, i.e. a much higher resistance than the almost intrinsic substrate presented in the documents PCT/FI2004/000492 and PCT/FI2005/000359. In the detectors of FIGS. 7-8 part of the secondary charges is collected inside the active area by the channel stop dopings and part of the secondary charges are transported through the bulk layer to a substrate contact 725. Due to the front illumination and due to the low resistive substrate no conducting back-side layer is needed. The difficulties associated to the manufacturing of the thin conductive back-side layer on the back side of a thin detector and to the operation of such a detector are thus avoided.

A major difference between afore described back and front illuminated detector embodiments is that the front illuminated detectors are much cheaper to manufacture than the back illuminated detectors, but the front illuminated detectors have a smaller fill factor and thus a smaller quantum efficiency in the visible spectrum than the back illuminated detectors.

Figure 11:
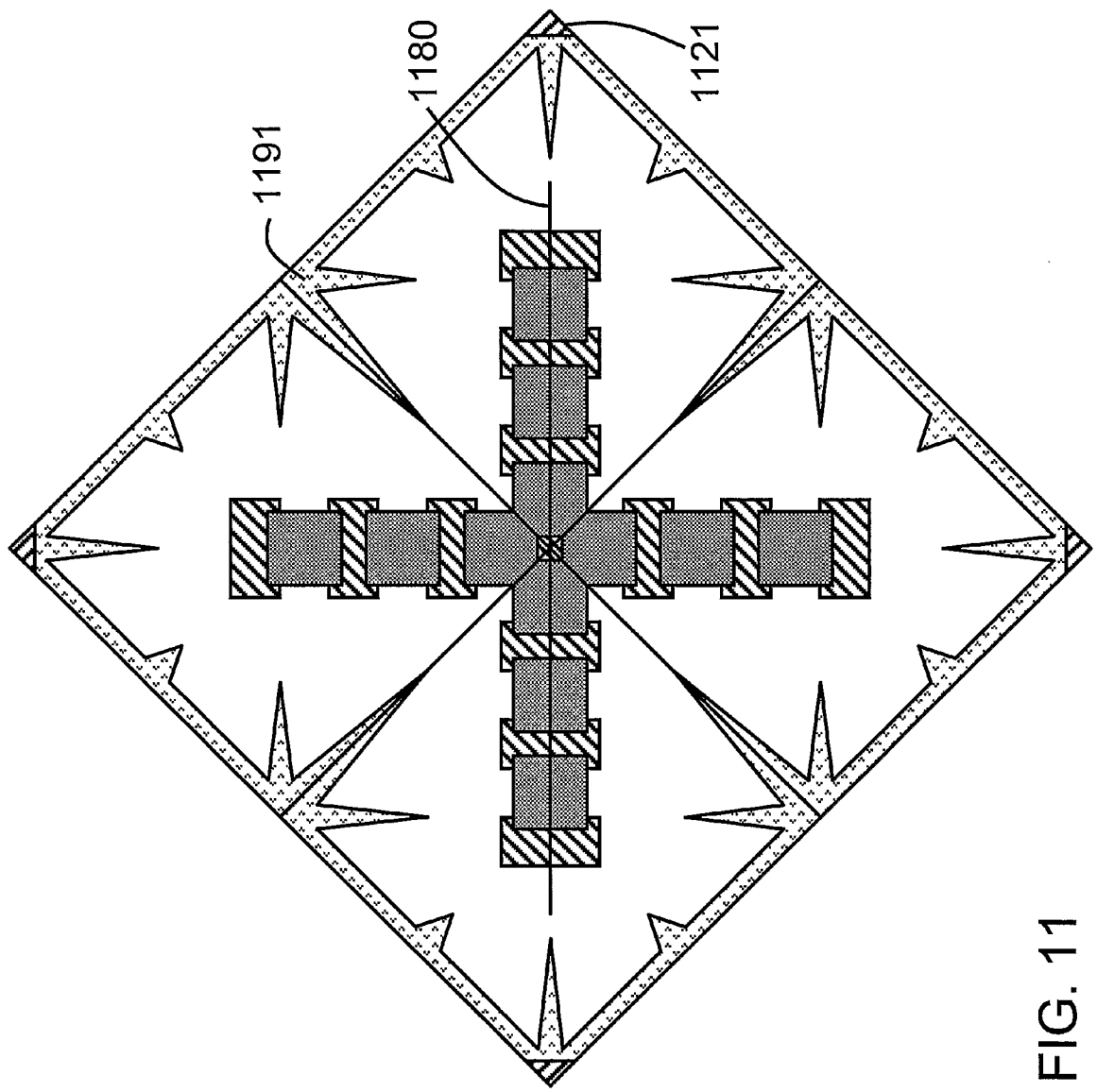
FIG. 11 illustrates four pixels of an embodiment of the invention.

FIG. 11 illustrates an embodiment of the invention where the signal charge can be cleared using only a small voltage, i.e. the pixel dopings do not have to be connected to a clear voltage in order to remove the signal charge. The area 1191 lacks the MIG layer meaning that the area 1191 corresponds to a MIG layer mask. The gap 1191 in the MIG layer aids the collection of the signal charges by improving the signal charge transporting potential gradient in the MIG layer. The channel stop doping 1121 collects the secondary charges. There are four pixels in the FIG. 11 of which the cut line 1180 cuts partially two pixels. The cut line 1180 corresponds to the cross section presented by FIG. 13. The pixel dopings 1131, 1132 and 1133 of the second conductivity type are source and drain dopings of a double metal oxide semiconductor field effect transistor (MOSFET) belonging to one pixel and the conductors 1341 and 1342 are the gates of the double MOSFET. The pixel dopings 1335, 1336 and 1337 are source and drain dopings and the conductors 1344 and 1345 are gates of a double MOSFET belonging to another pixel. The signal charges are collected in the optional local enhancements 1392 of the MIG layer dopings which are situated beneath the gates. The local enhancement of the MIG layer doping under the gate of a FET or under the emitter of a BJT improve the dynamic range of the detector. The signal charges can be moved inside the pixel between the local enhancements 1392 of MIG layer dopings by biasing the source and drain dopings and the gates properly. This enables multiple reading of the signal charge, which reduces the read noise.

There is on the front side of the device a pixel doping 1334 of the second conductivity type functioning as a clear contact. Between the MIG layer and the clear contact 1334 there is a doped region 1393 of the second conductivity type which can be produced by a medium energy implant. Alternatively the areas 1334 and 1393 represent a trench that is filled with semiconductor material of the second conductivity type. The flow of the signal charges from the MIG layer through the area 1393 is controlled by a gate 1343. This arrangement enables clearing of the signal charge with a low voltage and it can also be used as an anti blooming structure. The layer 1307 is a protective isolator layer which is preferably silicon dioxide but can also be any other isolator material. It is important to note that the contact openings through the isolator layer 1307 and the contacts are not presented in FIG. 13 for the sake of clarity.

Figure 12:
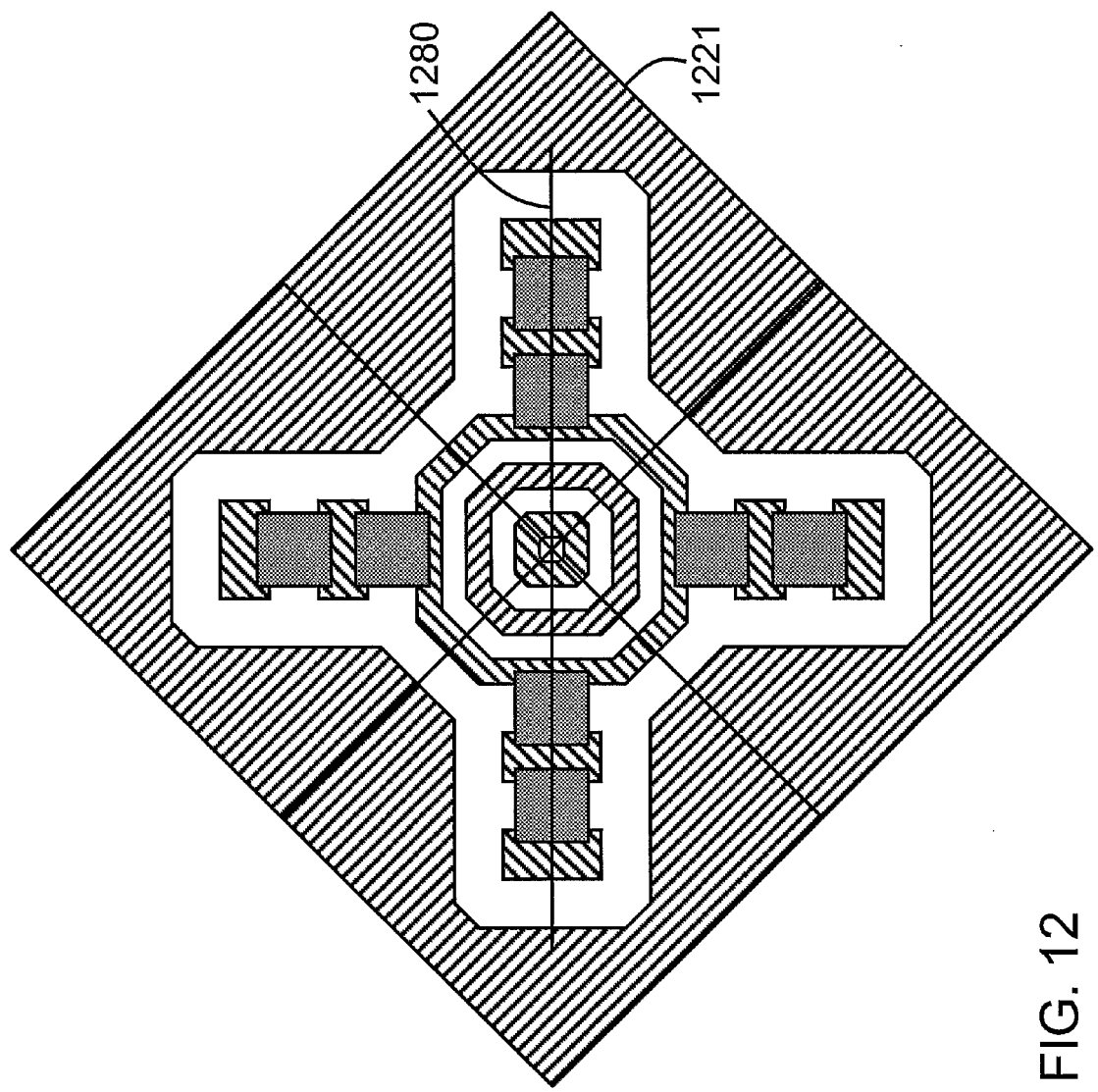
FIG. 12 illustrates four pixels of another embodiment of the invention.

FIG. 12 illustrates another embodiment of the invention where the signal charge can be cleared using only a small voltage. The channel stop doping 1221 collects the secondary charges. The cut line 1280 corresponds to a cross section presented by the FIG. 14. The MOS gate 1343 of FIG. 11 is replaced by a doping 1443 of the first conductivity type which acts as a junction gate controlling the flow of signal charges from the MIG layer to the front surface of the detector. The doping 1443 is surrounded by a circular pixel doping 1433 of the second conductivity type acting as the source/drain doping of four double MOSFETs. The second conductivity type doping 1434 acting as the signal charge clear contact is connected to the MIG layer using isolator material 1494 which is deposited on the walls of a trench. The isolator material 1494 is preferably silicon dioxide which is positively charged. Due to the positive oxide charges a 2D electron gas layer is formed on the interface of silicon dioxide and silicon. If the first conductivity type is p type and the second conductivity type is n type, the signal charges are electrons. Thus the signal charge electrons flow in the 2D electron gas layer from the MIG layer to the doping 1434, if the gate 1443 is biased properly.

The channel stop doping has to be very large like the channel stop doping 1221 in FIG. 12, if the isolator layer 1307 is positively charged and if the first conductivity type is p type and the second conductivity type is n type. In this case the channel stop doping acts as the radiation entry window. The MIG layer is also preferably structured below the large area channel stop doping 1221. If the isolator layer 1307 is positively charged and if the first type doping is n type and the second type doping is p type, the channel stop doping can be very small like the channel stop doping 1121 in FIG. 11. In this case there exists a 2D electron gas layer at the interface between the isolator layer 1307 and the semiconductor material every where else except at the close proximity of the pixel dopings 1331-1337 and the gates 1341-1345. The 2D electron gas layer and the isolator layer 1307 function in this case as the channel stop and as a radiation entry window which can be very thin. In addition to this the 2D electron gas layer transports the secondary charges to the channel stop doping 1121. Also the large area channel stop doping 1221 can be made very thin due to the fact that the secondary charge transport distances in this layer are very short. The thin radiation entry window enables good quantum efficiency for blue light.

Figure 15:
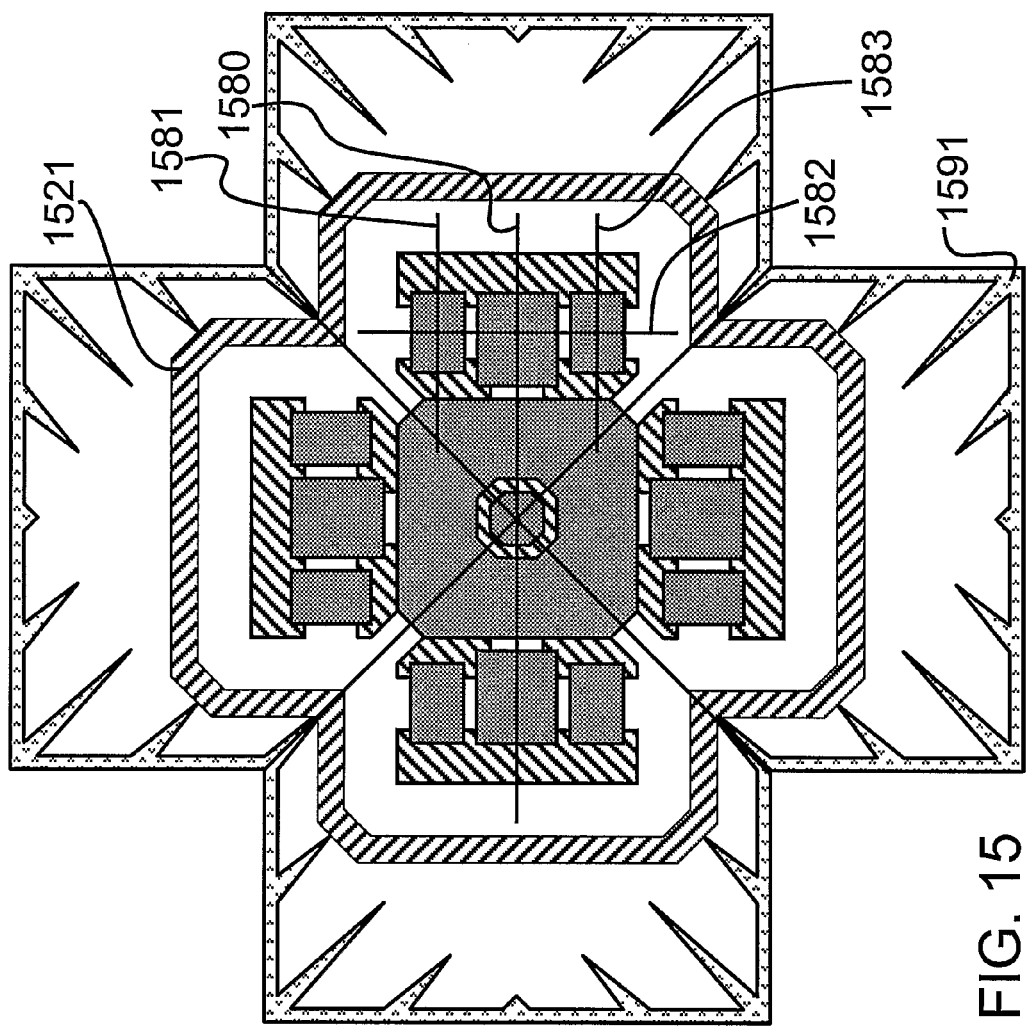
FIG. 15 illustrates four pixels of yet another embodiment of the invention.

FIG. 15 illustrates four pixels of yet another embodiment of the invention where the signal charge can be cleared using only a small voltage. The ring like channel stop doping 1521 collects the secondary charges. Out side this ring like doping 1521 positively charged isolator material forms a 2D electron gas layer at the isolator semiconductor interface which acts as a radiation entry window and as channel stop. The area 1591 lacks the MIG layer. The cut lines 1580, 1581, 1582 and 1583 correspond to the cross sections presented by FIGS. 16A, 16B, 16C and 16D. The pixel doping 1632 forming a source/drain and the gate 1646 belong to one pixel. The pixel dopings 1635, 1636 and 1637 forming sources and drains and the gates 1644, 1645 and 1647 belong to another pixel. The signal charge clear doping 1634 is connected to the MIG layer through an isolator layer 1494 which is covered by a conductor layer 1695. The conductor layer 1695 can be biased so that a 2D charge gas layer forms at the interface of the isolator and semiconductor materials. The conductor layer 1695 and the gates 1643, 1646 and 1647 can thus control the flow of signal charges from the MIG layer to the doping 1634. One can also divide this gate into four different parts belonging to each pixel (this applies also to the gate 1343). It is also possible to use only the conductor layer 1695 without the isolator material 1494 if the conductor material is chosen properly. In this case the signal charges can be collected by the conductor layer 1695.

One should note that the pixels of FIGS. 11, 12 and 15 are not to scale. The channel stop area including the area of the channel stop doping and the area of a possible 2D charge gas layer should cover a large portion of the total area of the pixel in order to enable a good quantum efficiency for blue light. The ratio of the channel stop area belonging to one pixel to the total pixel area should be at least 0.3. Beneficially this ratio should be more than the ratios 0.4, 0.5, 0.6, 0.7, 0.8, 0.9, where the 0.9 corresponds to the most beneficial ratio and 0.4 corresponds to the least beneficial ratio.

It is also worth to note that the gap in the MIG layer is not the only way to improve the signal charge transporting potential gradient in the MIG layer. One can also alter the doping concentration in the barrier layer, in the MIG layer or in the bulk layer next to the MIG layer. It is possible to reduce or enhance the MIG layer doping for instance by suitable implants and mask structures. Increasing locally the barrier layer doping, reducing locally the MIG layer doping and increasing locally the bulk layer doping next to the MIG layer doping create local potential minima for the signal charges inside the MIG layer. On the other hand by reducing locally the barrier layer doping, by increasing locally the MIG layer doping and by reducing locally the bulk layer doping next to the MIG layer one can create local potential maxima for the signal charges in the MIG layer. By structuring the enhancements or reductions in the MIG layer properly one can improve the signal charge transporting potential gradient in the MIG layer in a similar manner than the gap in the MIG layer doping. The signal charge transporting gradient should be such that a proper gradient exists everywhere in the MIG layer transporting the signal charges towards to the desired location which is for example the local enhancement 1392 of the MIG layer doping. Also the local enhancement of the MIG layer doping can be structured by adding points to the doping so that it resembles a star in order to increase the signal charge transporting potential gradient in the MIG layer. If the ratio of the channel stop area to the total pixel area is big one may be forced to use instead of one of aforesaid methods several methods at the same time in order to guarantee a large enough signal charge transporting potential gradient in the MIG layer.

Yet another important aspect is that instead of the doping 1393 of the second conductivity type connecting the MIG layer and the clear contact 1393 one can also use a local reduction in the barrier layer doping. This local reduction of the barrier layer doping should be situated at the same location than the doping 1393, i.e. below the clear contact 1393 and surrounded by the clear gate 1343. The ratio of the net doping concentration in the first conductivity type local reduction of the barrier layer doping to the net doping concentration in the first conductivity type barrier layer doping without the local reduction of the barrier layer doping should be less than 0.9. Beneficially the ratio should be less than 0.8, 0.7, 0.6, 0.5, 0.4, 0.3, 0.2 and 0.1 where 0.8 is the least beneficial ratio and 0.1 is the most beneficial ratio. The removal of the signal charge requires a higher voltage for the clear contact 1393 through the local reduction of the barrier layer doping of the first conductivity type than through the doping 1393 of the first conductivity type. The doping 1393 is thus more beneficial than the local reduction of the barrier layer doping.

Figure 17A:
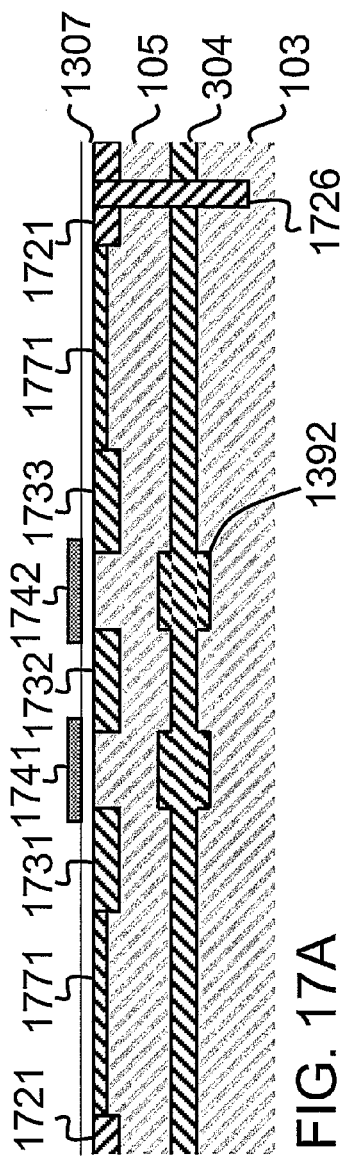
FIG. 17A illustrates an embodiment of the invention.
Figure 17B:
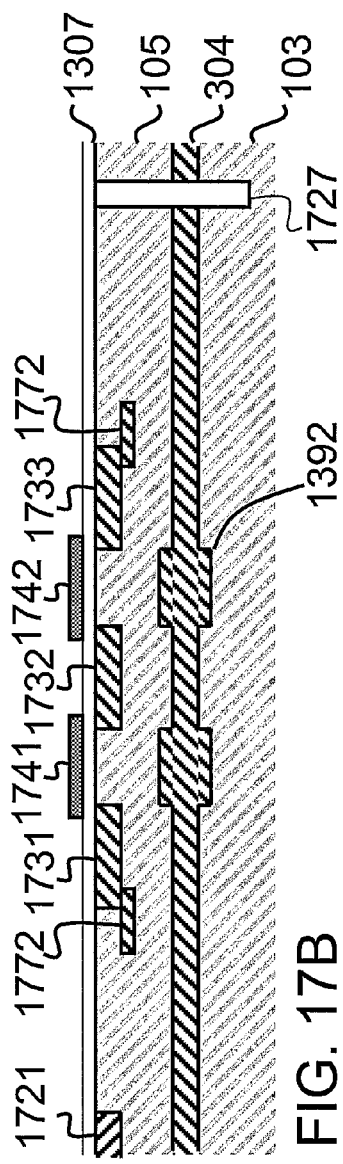
FIG. 17B illustrates an embodiment of the invention.
Figure 17C:
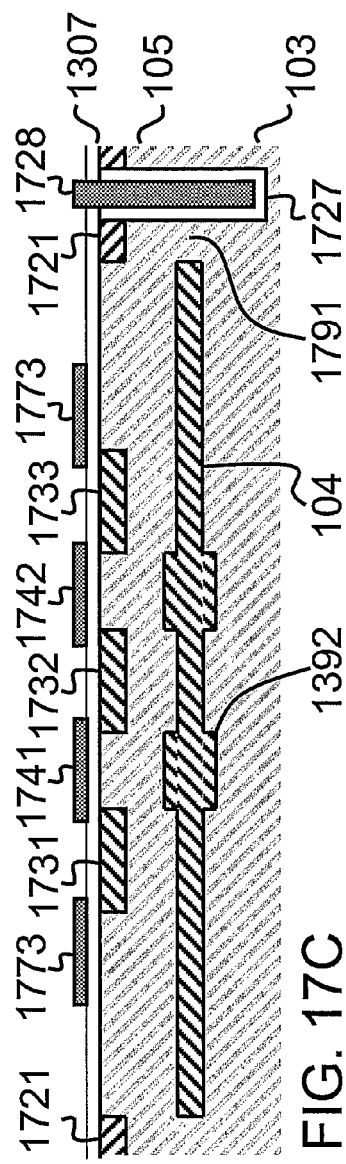
FIG. 17C illustrates an embodiment of the invention.
Figure 17D:
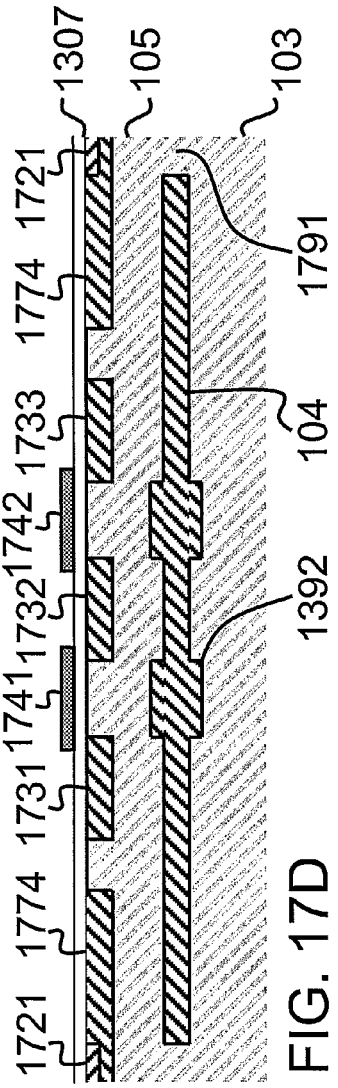
FIG. 17D illustrates an embodiment of the invention.
Figure 17E:
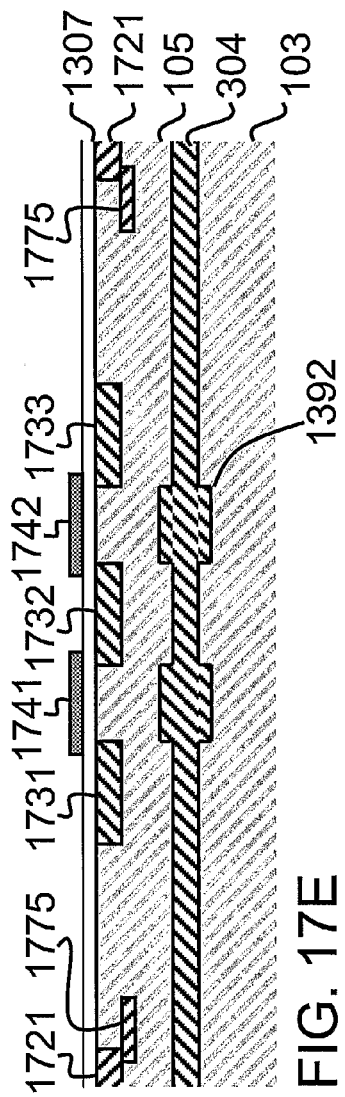
FIG. 17E illustrates an embodiment of the invention.
Figure 17F:
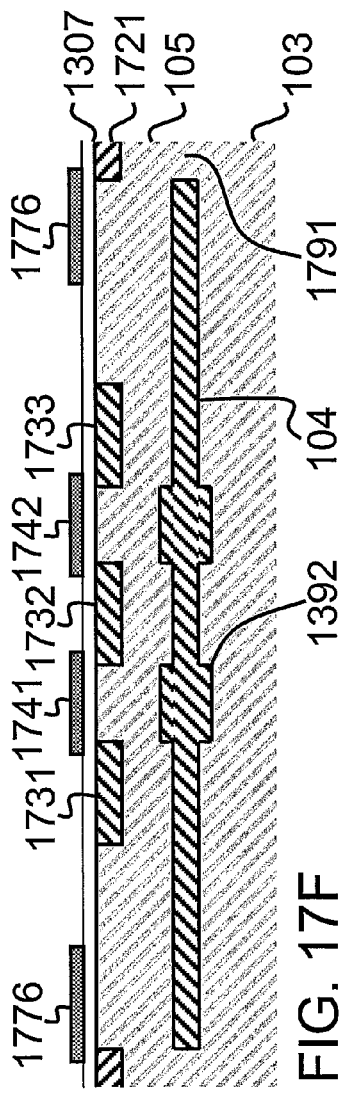
FIG. 17F illustrates an embodiment of the invention.

The embodiments of FIGS. 17A, 17B and 17C illustrate ways to improve the separation of the signal and surface generated charges and ways to improve the collection of the secondary charges from the bulk layer. The FIGS. 17D, 17E, 17F, 17 G, 17H and 17I illustrate additional ways to improve the separation of the signal and surface generated charges. The pixel dopings 1731, 1732 and 1733 form the source and the drain and the conductors 1741 and 1742 form the gates of the double MOSFET. The channel stop doping 1721 collects the secondary charges.

The collection of the secondary charges from the bulk layer can be improved by filled trenches. The trench in FIG. 17A is filled with semiconductor material 1726 of first conductivity type; the trench in FIG. 17B is filled with isolator material 1727 and the trench in FIG. 17C is filled with isolator material 1727 and conductor material 1728. One can remove the isolator material from the device of FIG. 17C if the conductor material is chosen properly. The semiconductor material 1726 of first conductivity type could be also replaced by a plurality of first conductivity type deep implants having different energies. The operation principle of the structures 1726, 1727 and 1728 improving the collection of the secondary charges from the bulk layer resembles the operation principle of the structures 1393, 1494 and 1695 clearing the signal charges from the MIG layer. In this case, however, secondary charges are collected in stead of signal charges. In devices having a thin bulk layer the filled trenches 1726, 1727 and 1728 can penetrate through the whole bulk layer. The collection of the secondary charges can further be improved by surrounding the filled trenches 1726, 1727 and 1728 by a gap 1791 in the MIG layer. The filled trenches 1726, 1727 and 1728 may have any shape; they may be for instance cylinder shaped or they may surround the whole pixel. If the trenches are deep enough the neutral bulk layer potential of FIGS. 5 and 6 can be brought to the channel stop potential, a situation corresponding to FIG. 4.

The dopings 1771, 1772 and 1774 of the second conductivity type, the doping 1775 of the first conductivity type and the gates 1773 and 1776 in FIGS. 17A-17F improve the separation of the signal and surface generated charges. The doping 1771 of the second conductivity type in FIG. 17A is preferably depleted resulting in a channel for the surface generated charges of the second conductivity type. This channel guides the surface generated charges of the second conductivity type towards the pixel dopings 1731 and 1733. The doping 1774 of the second conductivity type in FIG. 17D surrounds the channel stop doping 1721. The doping 1774 is separated from the pixel doping but could equally well reach to the pixel doping just like the doping 1771 in FIG. 17A. The doping 1774 is also in this case preferably depleted. The area of the depleted surface can be controlled by the bias of the gate 1773 in FIG. 17C. The gate 1776 in FIG. 17F can be biased such that a channel for the surface generated charges of the second type is formed below the gate improving the separation of the signal and surface generated charges. The dopings 1772 and 1775 alter the potential profile in the device in order to improve the separation of signal and surface generated charges. Instead of the second conductivity type doping 1771 one can also use a first conductivity type doping which is preferably partially depleted.

Figure 17G:
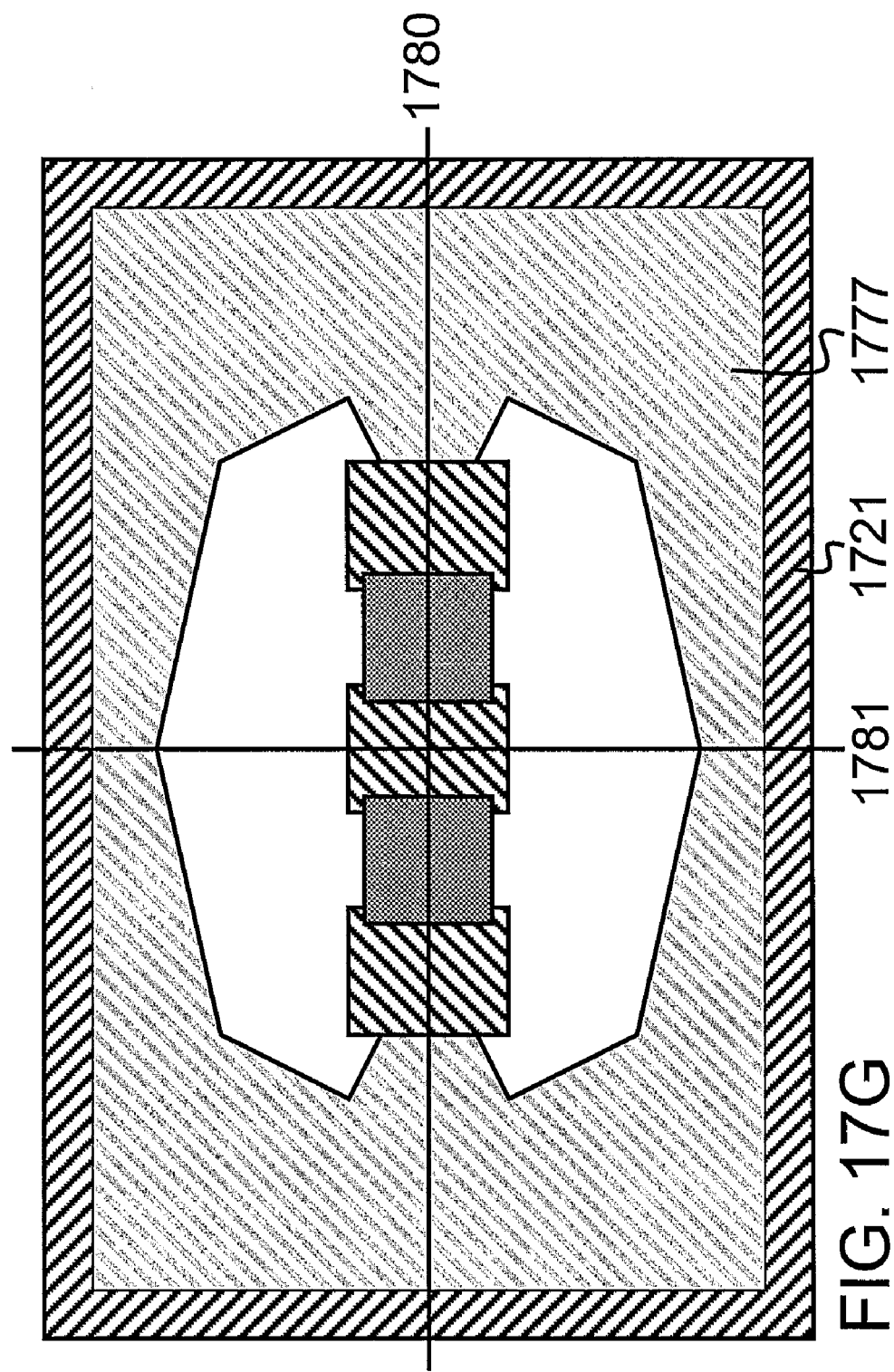
FIG. 17G illustrates an embodiment of the invention.
Figure 17H:
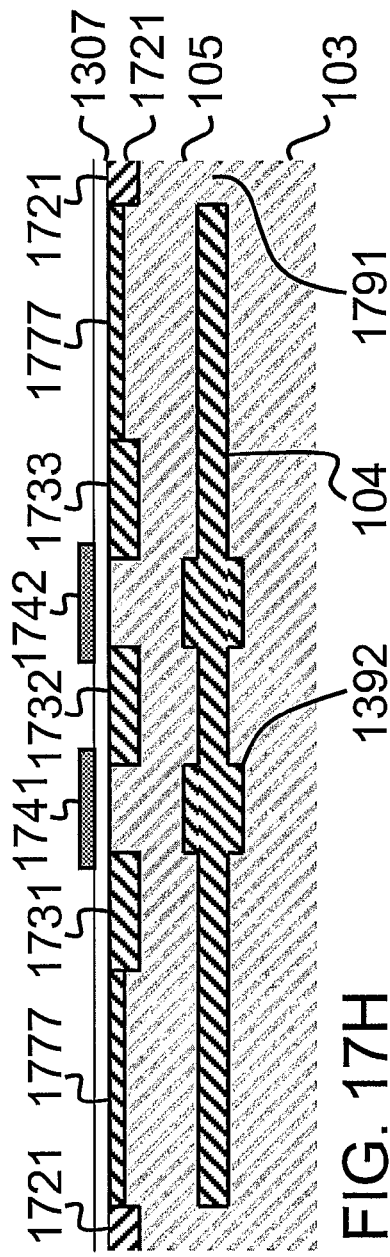
FIG. 17H illustrates a cross-section of the detector presented in FIG. 17G.
Figure 17I:
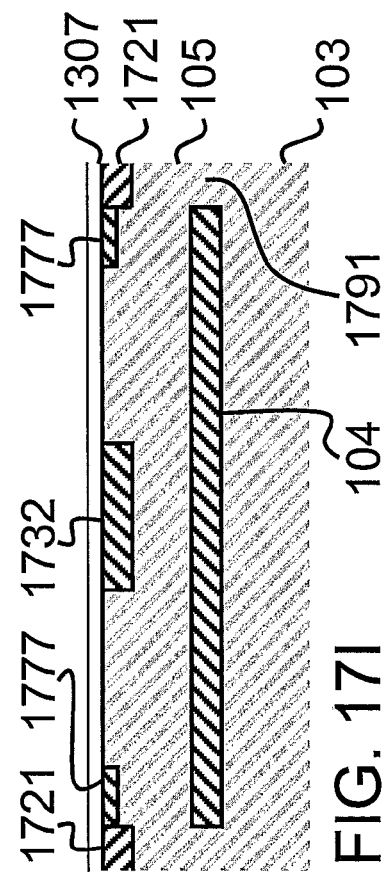
FIG. 17I illustrates a cross-section of the detector presented in FIG. 17G.

In order to prevent the doping 1771 of the second conductivity type from forming a conductive path between the pixel dopings 1731, 1732 and 1733, the doping 1771 is preferably structured. An embodiment of such structuring is presented in FIG. 17G, where the doping 1777 corresponds to the doping 1771. The cut lines 1780 and 1781 correspond to the cross-sections presented in FIGS. 17H and 17I. In FIG. 17G the ratio of the smallest distance between the doping 1777 and the gates 1741 and 1742 and the source/drain doping 1732 is beneficially larger than 0.1 times the distance L between the source/drain dopings. Beneficially the ratio should be more than 0.2 L, 0.3 L, 0.4 L, 0.5 L, 0.6 L, 0.7 L, 0.8 L, 0.9 L, L, 1.2 L, 1.5 L and 2 L, where the first one is least beneficial ratio and the last one is the most beneficial ratio.

The embodiments of FIGS. 18A, 18B and 18C illustrate ways to improve the dynamic range of the detector, i.e. to improve the signal charge capacity of the MIG. The pixel dopings 1831 and 1833 are source/drain dopings and the conductors 1841 and 1842 are the gates of a double MOSFET. The signal charge capacity of the MIG layer is already improved by the local enhancements 1392 of the MIG layer doping. In FIG. 18A the signal charge capacity of the MIG is further improved by making the source/drain doping 1832 wider and by adding a gap 1891 in the MIG layer between the two local enhancements 1392 of the MIG layer doping. In FIG. 18B the signal charge capacity of the MIG is improved by splitting the source/drain doping 1832 into two separate parts 1834 and 1835 and by adding a gate 1843 in between. In FIG. 18C the signal charge capacity is further improved by adding between the two dopings 1834 and 1835 a doping of the second conductivity type 1836 and two gates 1844 and 1845.

The MOSFET is not the only possible transistor to be used in conjunction with the MIG. In FIG. 19 MOSFETs are replaced by BJTs. The pixel dopings 1931 and 1932 of the second conductivity type are the base dopings and the dopings 1951 and 1952 of the first conductivity type are the emitter dopings of the BJTs. The channel stop doping 1921 of the first conductivity type acts as the collector of the BJTs collecting the charges of the first conductivity type emitted by the emitters. In addition to the three conventional nodes of the BJT there is a fourth node, i.e. the MIG. The signal charges in the MIG reduce the effective base width. The signal charges in the MIG increase thus the emitter current. This effect can be measured and the amount of signal charges can be deduced from this measurement. The pixel doping 1931 contains an additional buckling 1974. There is also a local enhancement 1929 of the barrier layer doping under the channel stop doping 1321 which increases the electric field component in the MIG layer that transports the signal charges towards the local enhancement 1392 of the MIG layer doping. The form of this local enhancement of the barrier layer doping may also be structured in the same way than the gaps 1191 and 1591 in the MIG layer doping.

In FIG. 20 the MOSFETs are replaced by junction field effect transistors (JFET) where the gate dopings are replaced by MOS gates 2041 and 2042. The pixel dopings 2031 and 2032 act as the source, drain and channel dopings. The pixel dopings have also a buckling 2075.

Figure 21:
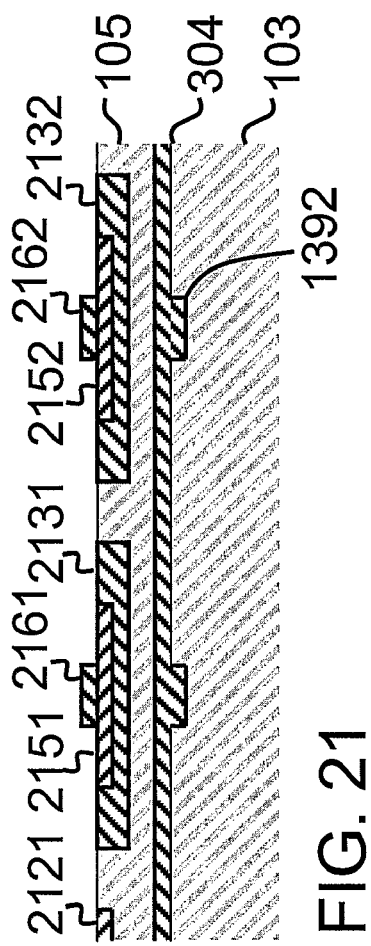
FIG. 21 illustrates an embodiment of the invention.
Figure 22:
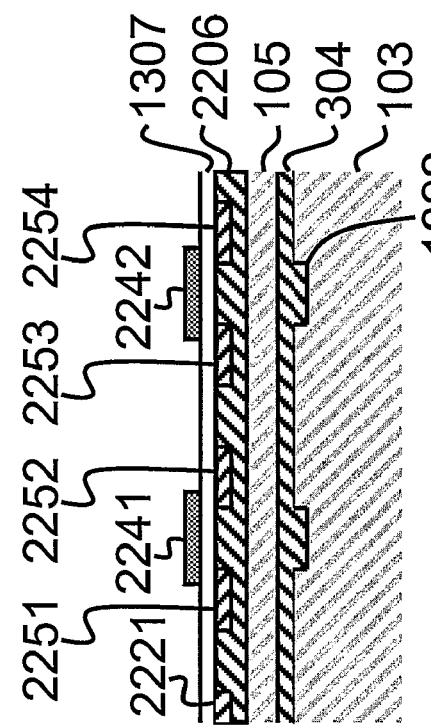
FIG. 22 illustrates an embodiment of the invention.

In all of the transistors comprising the MIG that have been introduced until now the signal charges in the MIG decreases the effective channel or base width. FIGS. 21 and 22 illustrate transistors comprising the MIG where the signal charges in the MIG increase the effective channel or base width. In FIG. 21 the pixel dopings 2131 and 2132 act as collector dopings and the dopings 2151 and 2152 of the first conductivity type act as base dopings. The emitters 2161 and 2162 are formed for instance of polycrystalline semiconductor material like of polycrystalline silicon. In FIG. 22 the pixel doping 2206 is a continuous layer encapsulating the channel stop doping 2221. Inside the pixel doping 2206 of first conductivity type there are also the source and drain dopings 2251, 2252, 2253 and 2254 of two MOSFETs. The conductors 2241 and 2242 are the gates of the two MOSFETs.

Figure 23:
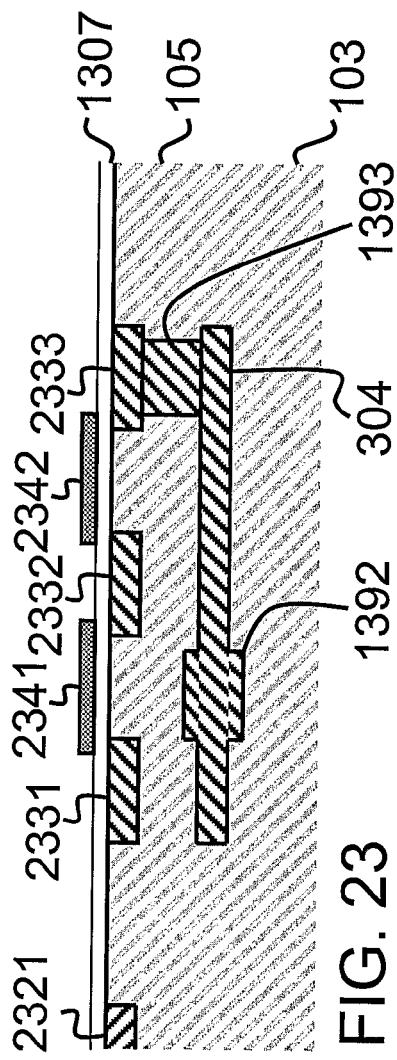
FIG. 23 illustrates an embodiment of the invention.
Figure 24:
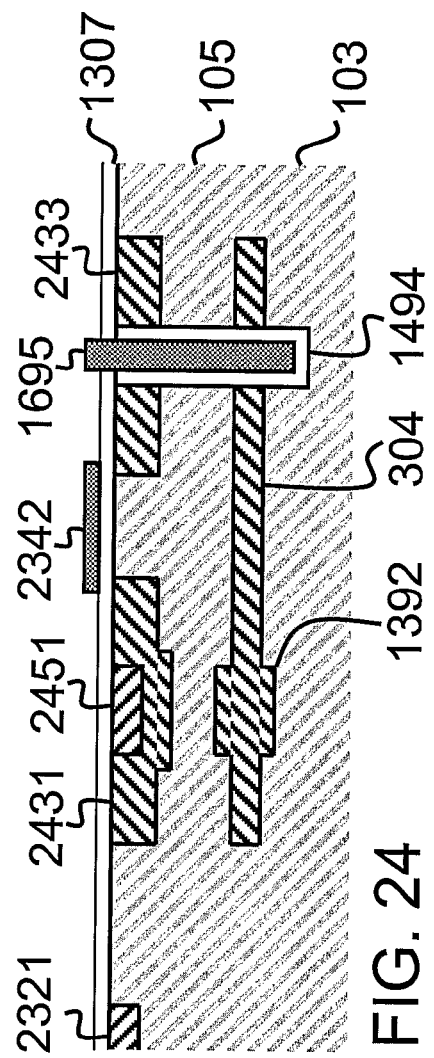
FIG. 24 illustrates an embodiment of the invention.

FIGS. 23 and 24 illustrate semiconductor devices that can be used as memory units or as transistors. The dopings 2331 and 2332 of the second conductivity type are the drain and source and the conductor 2341 is the gate of a MOSFET. The gate 2342 controls the flow of the signal charges from the doping 2333 of the second conductivity type through the region 1393 of second conductivity type to the MIG layer. In FIG. 24 the MOSFET is replaced by a BJT having a base 2431 of the second conductivity type and an emitter 2451 of the first conductivity type. In the device of FIG. 24 the filled trench 1494, 1695 has the same function as the doped region 1393 in FIG. 23. If the devices of FIGS. 23 and 24 are used as memory cells, a MIG full of signal charges and a MIG empty of signal charges correspond to one and zero or vice versa. If the devices in FIGS. 23 and 24 are used as transistors the MIG layer may be very heavily doped, i.e. it may be neutral inside, and it forms a fourth node in the transistors in addition to the source, drain and gate in FETs and in addition to the emitter, base and collector in BJTs.

There exists still one more way to operate the MIG detector and the novel MIG detector that has not been previously introduced. In this case the source, drain and gate potentials of a FET are such that the channel below the gate is closed, i.e. there exists no current path between the source and drain dopings. If the source and drain dopings are at same potential, one can use only one pixel doping instead of two separate ones (see e.g. FIG. 25). When for instance an optical pulse is absorbed in the detector signal charges will flow to the MIG. This will create a current pulse in the gate and this current pulse can be used for precise timing of the incident. Novel MIG detectors corresponding to the gate signal detection mode are presented in FIGS. 25-31. The cut line 2580 in FIG. 25 and the cut line 2680 in FIG. 26 correspond to the cross-section presented in FIG. 27A. The potential of the optional channel stop doping 2721, of the pixel doping 2731 and of the gate 2741 are such that the semiconductor isolator interface under the gate is depleted to enable the formation of gate signals. If the semiconductor isolator interface is locked at the pixel doping potential, i.e. if there exists a channel below the gate no signal or only a very weak signal will be produced in the gate when a number of signal charges arrive at the MIG. The signal charge is cleared for instance by applying a clear bias between the channel stop doping and the pixel doping.

Figure 25:
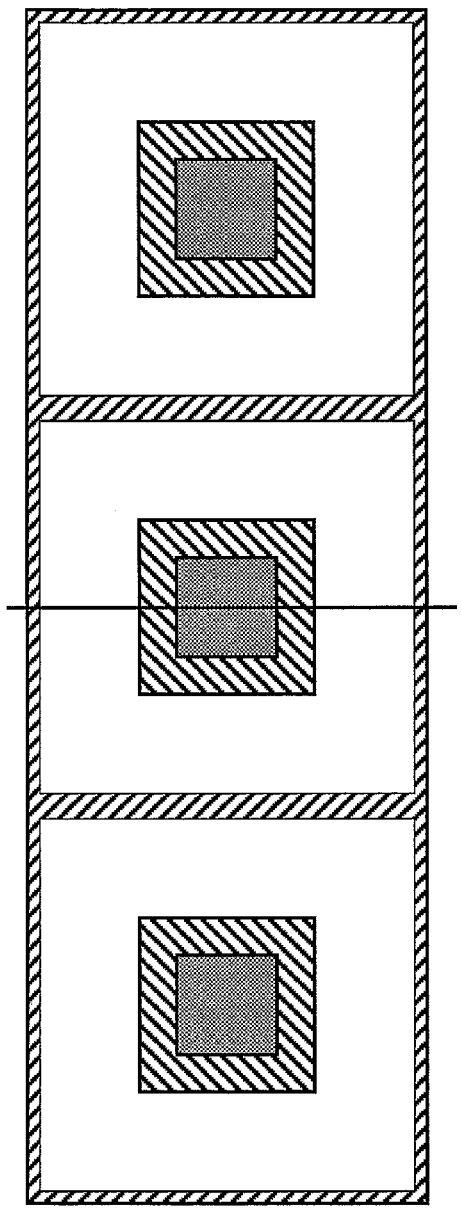
FIG. 25 illustrates a gate signal modified internal gate detector.
Figure 26:
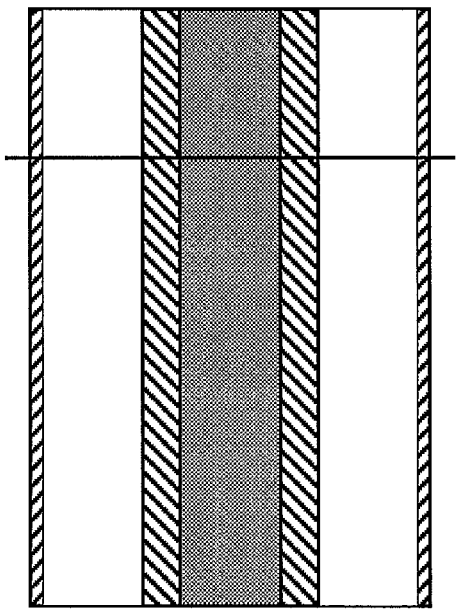
FIG. 26 illustrates another embodiment of the gate signal modified internal gate detector.
Figure 27B:
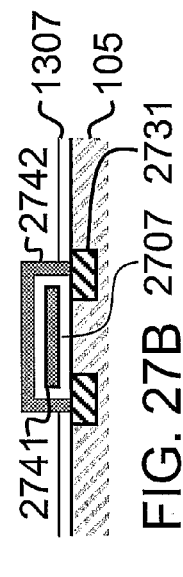
FIG. 27B illustrates a cross-section of the detector presented in FIG. 26.
Figure 27A:
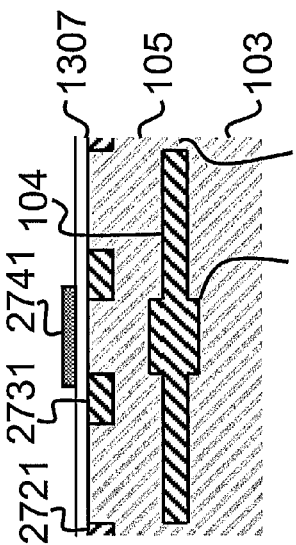
FIG. 27A illustrates a cross-section of the detectors presented in FIGS. 25 and 26.

The gate signal MIG detector of FIG. 25 can be bonded to a read-out chip. In this case due to the pixelated detector structure both time and 2D position information can be obtained. Another possibility is to connect the gates of one row or column of pixels by a metal wire in order to form a strip detector. The strip detector enables the detection of time and one dimensional (1D) position information. Yet another possibility is to divide the gate into two or three different parts and to connect each part to a different signal line which point to different directions in order to achieve both time and 2D position information. The gate signal MIG detector of FIG. 26 is a strip detector and the cut line 2680 corresponds to the cross-section presented in FIG. 27A. In FIG. 27B the gate 2741 of the detector in FIG. 26 is surrounded by an isolator layer 2707 on top of which is a metal cover 2742. The optional metal cover 2742 further reduces the noise of the detector.

Figure 28:
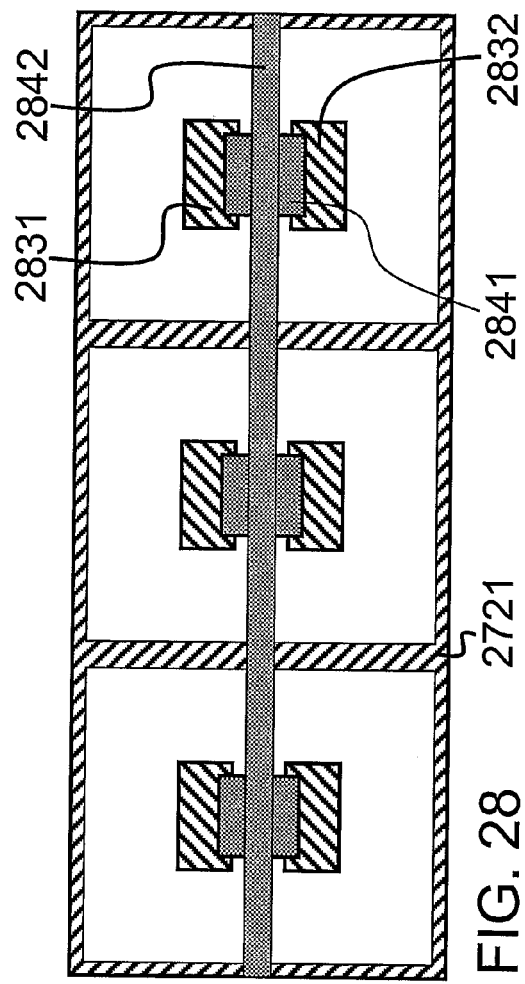
FIG. 28 illustrates a gate signal modified internal gate detector.

The strip detectors in FIGS. 28-31 represent different embodiments of the gate signal MIG detector. In FIG. 28 the gate 2841 is connected to a second layer metal 2842 which is used to connect the gates in one row or column of pixels. The pixel doping is in this case separated in two parts 2831, 2832.

Figure 29:
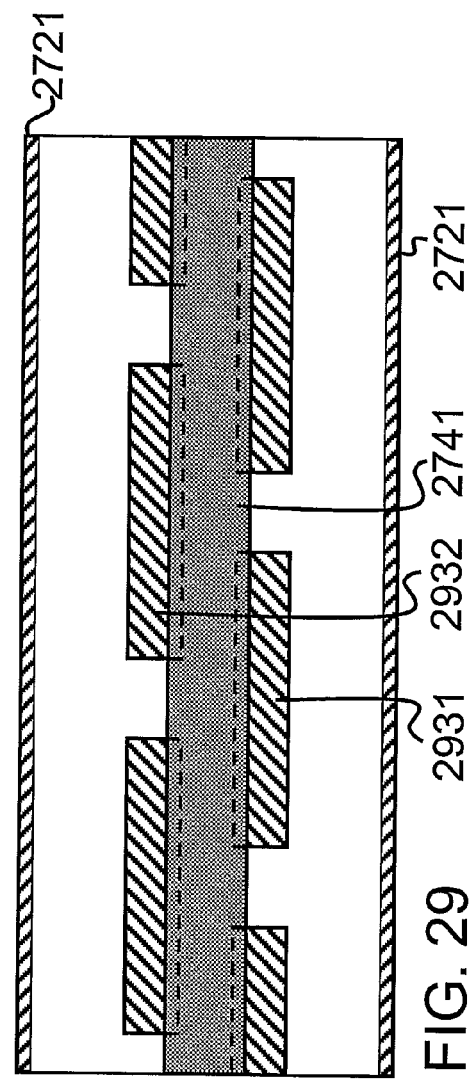
FIG. 29 illustrates another embodiment of the gate signal modified internal gate detector.

The detector in FIG. 29 is the same than in FIG. 26 except that the pixel doping 2731 is divided into a number of parts 2931, 2932. The broken line in FIG. 29 corresponds to the pixel doping that is located under the gate. The same practice is also applied in FIGS. 30 and 31. The detector in FIG. 30 has only one pixel doping 3031 next to which are two gates 3041 and 3042. In FIG. 31 there is only one gate 3141 and a multitude of pixel dopings 3131. An enhancement of the MIG layer doping can be located for instance under the gates in FIGS. 28-31.

Prior art strip detectors are presented in FIGS. 35A and 35B. In the structure of FIG. 35A the signal charges are collected by the doping 3531 which alters the potential of the doping 3531. This creates a signal to the gate 3541 which is held at constant potential. The doping 3531 collects, however, also the surface generated current in addition to the bulk generated current. This leakage current results in also a current of equal size in the gate. The noise in the detector is comparable to the square root of the leakage current. The surface generated current is typically around 20 times higher than the bulk generated current in such strip detectors and thus the noise of the strip detector in FIG. 35A is high. In the prior art device of FIG. 35B the dopings 3532 and 3533 collect the surface generated charge meaning that the doping 3531 collects only the bulk generated current. The dopings 3532 and 3533 collect, however, also part of the signal charges. Thus the signal to noise ratio is typically poorer in the strip detector of FIG. 35B than in the strip detector of FIG. 35A. The signal to noise ratio of the strip detector in FIG. 35A and of the gate signal MIG detector can be easily compared. The parasitic to total capacitance ratio of the device in FIG. 35A is close zero. In the gate signal MIG device the parasitic to total capacitance ratio is around 0.5 resulting in a half smaller signal than in the prior art device. However, in the MIG detector the pixel dopings collect the surface generated charges and the MIG collects only the bulk generated current. Thus the noise in the prior art device of FIG. 35A is square root of 20 higher than in the MIG detector. Thus the signal to noise ratio in the MIG detector is estimated to be 2.2 times higher than in the prior art detector of FIG. 35A.

The signal charge may also be transferred across a number of pixels to a readout pixel, where the amount of signal charge is measured. The device presented in FIG. 44A is an example of such a device which is operated in the same fashion than a charge coupled device (CCD). When the potentials of the pixel dopings 4431, 4432 and 4433 of the first conductivity type are changed cyclically the signal charge can be transported in the MIG layer 104. The pixel dopings operate also as antiblooming structures. The signal charge in the MIG layer can be removed by applying a clear voltage between the channel stop dopings 4421 and the pixel dopings. If the device is front illuminated the size of the channel stop area should be large in order to have a good quantum efficiency for blue light. The cut lines 4480 and 4481 correspond to the cross-sections presented by the FIGS. 44B and 44C.

Figure 32A:
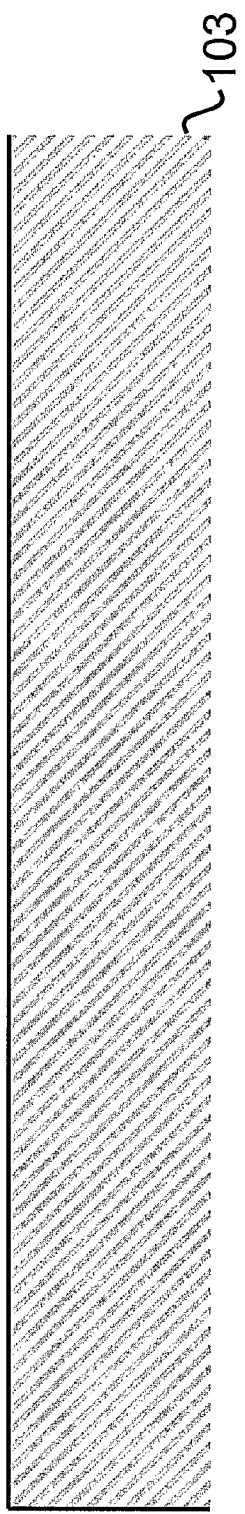
FIG. 32A illustrates one process step of one possible detector manufacturing process.
Figure 32B:
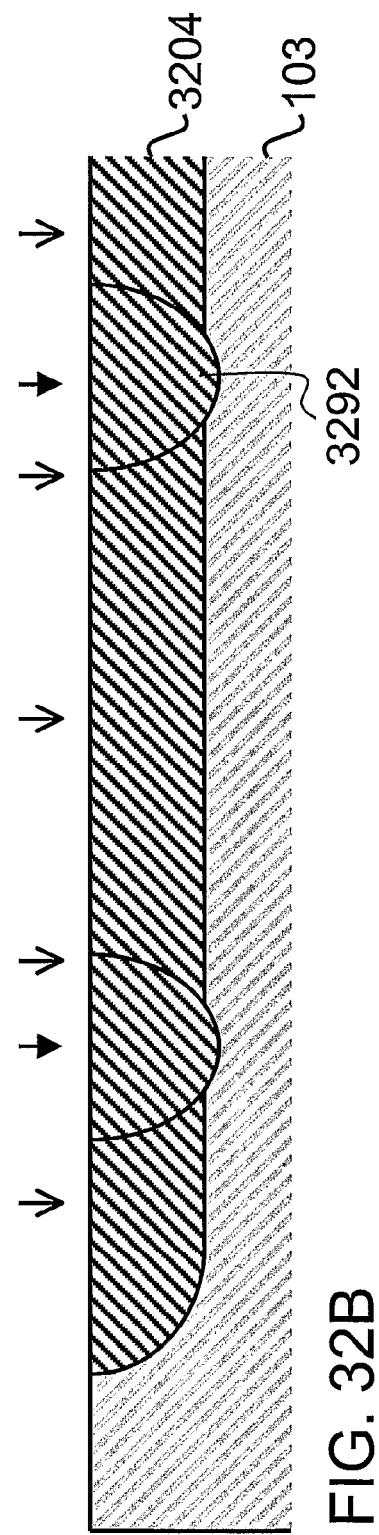
FIG. 32B illustrates one process step of one possible detector manufacturing process.
Figure 32C:
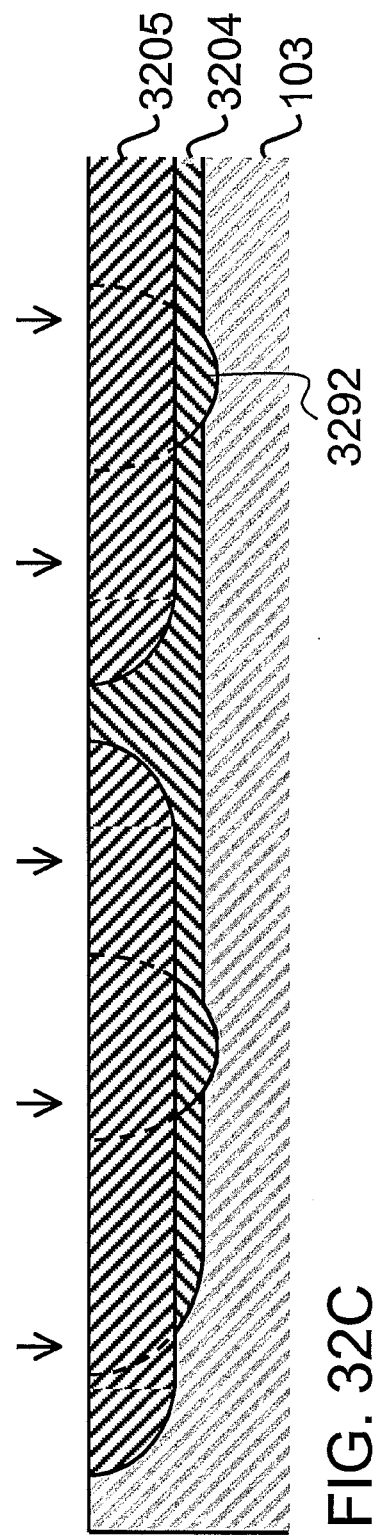
FIG. 32C illustrates one process step of one possible detector manufacturing process.
Figure 32D:
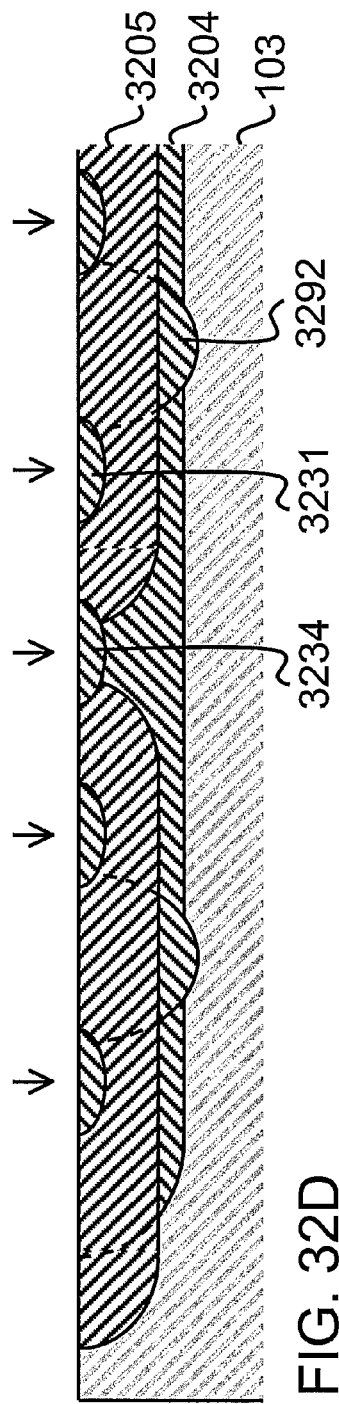
FIG. 32D illustrates one process step of one possible detector manufacturing process.

The FIGS. 32B-32D, 33A-33C and 34A-34D represent examples of different manufacturing methods of the novel MIG detector. The starting point of these processes is the bare substrate 103 of first conductivity type presented in the FIG. 32A. The manufacturing process presented in FIGS. 32B-32D resembles a CMOS process. In FIG. 32B two masking steps two second type implants and a drive in is performed in order to form a well 3204 and a doped region 3292 both being of second conductivity type. The well 3204 is used form the MIG layer and the optional doped region 3292 is used to form the enhancement of the MIG layer doping. In FIG. 32C one masking step, one implant of first conductivity type and a drive in is performed in order to form the well 3205 of first conductivity type. The well 3205 acts as the barrier layer. In FIG. 32D at least one mask step and implant is carried out to form the pixel doping 3231 of second conductivity type. The doping 3234 of the second conductivity type is an optional signal charge clear contact. At this stage also other mask and implant steps can be performed forming for instance channel stops, substrate contact and other previously introduced doped regions. After this an annealing step is performed which is followed by the formation of isolator and metal layers and of vias through the isolator layers.

Figure 33A:
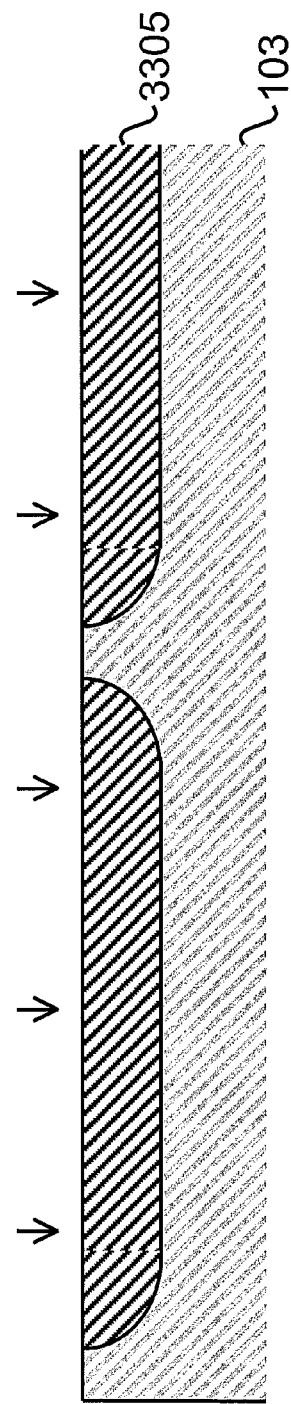
FIG. 33A illustrates one process step of one possible detector manufacturing process.
Figure 33B:
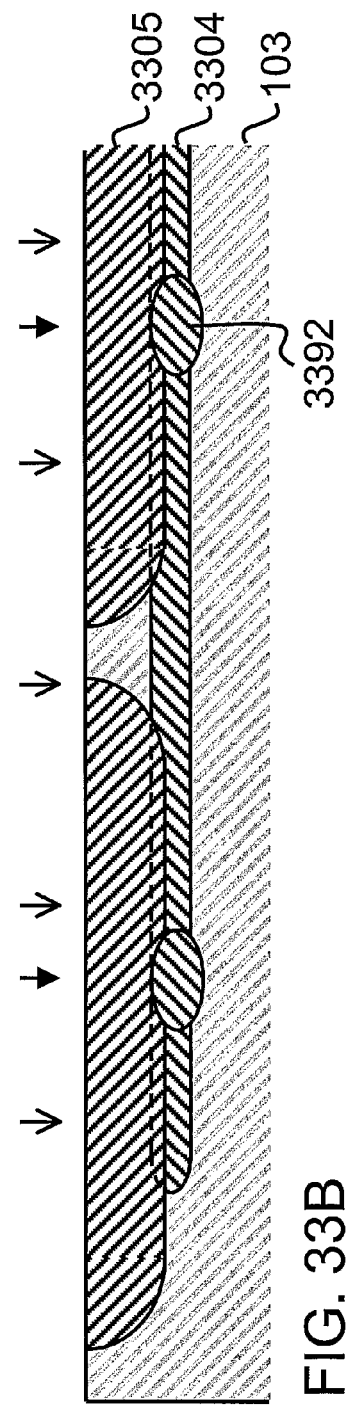
FIG. 33B illustrates one process step of one possible detector manufacturing process.
Figure 33C:
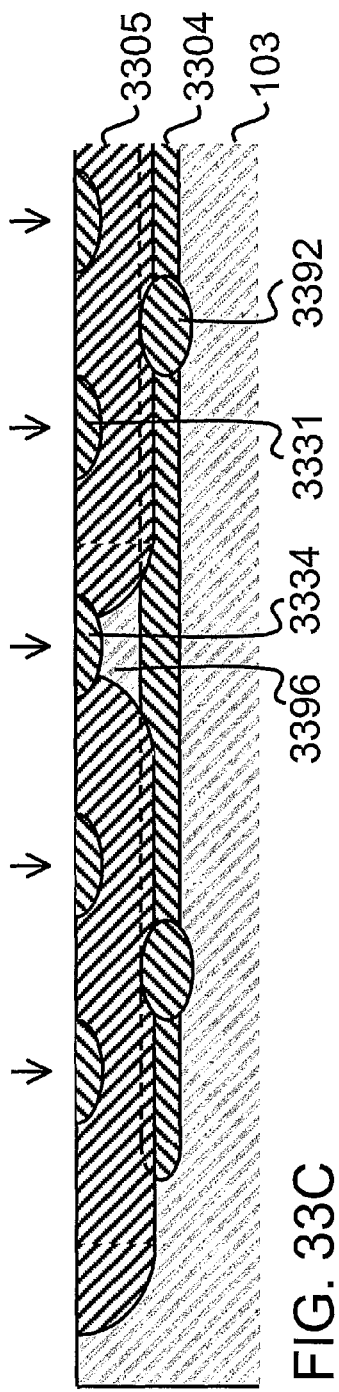
FIG. 33C illustrates one process step of one possible detector manufacturing process.

A manufacturing method of the novel MIG detector involving deep implants is presented in FIGS. 33A-33C. In FIG. 33A one mask step, one implant of first conductivity type and a drive in is performed in order to form the well 3305 of first conductivity type. The well 3305 acts as the barrier layer. In FIG. 33B two mask steps and two high energy deep implants of second conductivity type are done in order form the MIG layer 3304 and the optional enhancement 3392 of the MIG layer doping. One mask step and one second type implant are maid in FIG. 33C in order to form the pixel doping 3331. The doping 3334 of the second conductivity type is an optional signal charge clear contact. The region 3396 is a local reduction of the net barrier layer doping situated under the clear contact. At this stage also other mask and implant steps may be performed. Next an annealing step is carried out which is followed by the formation of isolator and metal layers and of vias through the isolator layers. The well 3305 forming the barrier layer could equally well be manufactured using a medium energy implant.

Figure 34A:
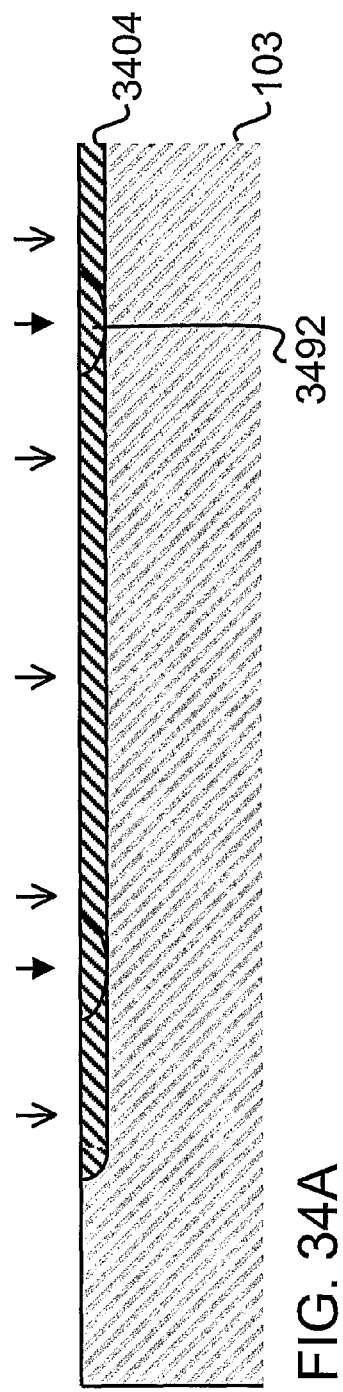
FIG. 34A illustrates one process step of one possible detector manufacturing process.
Figure 34B:
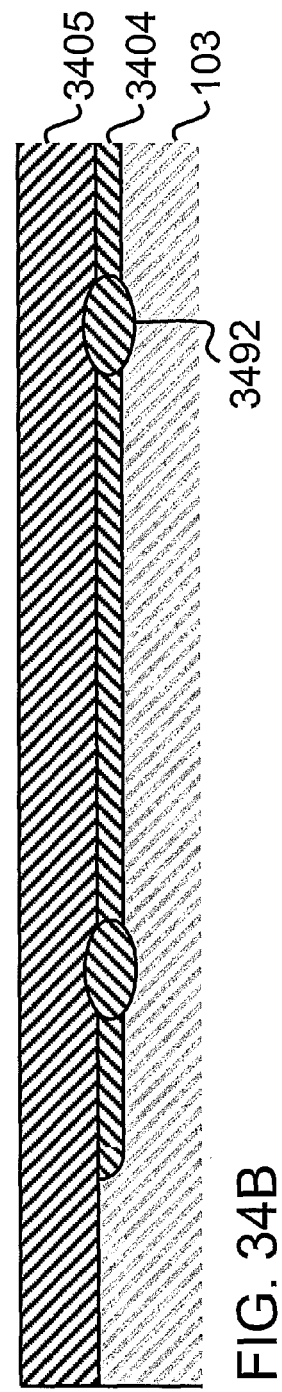
FIG. 34B illustrates one process step of one possible detector manufacturing process.

The manufacturing process presented in FIGS. 34A-34D resembles a BiCMOS process. In FIG. 34A two mask steps and two implants of second conductivity type and an optional annealing step are performed in order to form the MIG layer 3404 and the optional enhancement 3492 of the MIG layer doping. In FIG. 34B an epitaxial layer 3405 of the first conductivity type is grown on top of the semiconductor substrate 103. The epitaxial layer 3405 forms the barrier layer. In FIG. 34C one mask step and one first type implant is made on the epilayer 3405 in order to form the pixel doping 3431 and the optional clear contact 3434. At this stage other mask and implant steps may be performed in order to form for instance the channel stops. In FIG. 34D is presented an optional mask and second conductivity type medium energy implant step in order to form a second type doping 3493 between the clear contact 3434 and the MIG layer 3404. One should note that if the dose of this second type medium energy implant is low only a reduction of the net barrier layer doping is resulted under the clear contact 3434.

One should note that the previously presented methods to manufacture the novel MIG detector are just examples. Besides them there exist numerous other methods. The previously introduced different process steps of the different methods can also be combined in any suitable way or order. The substrate contact and the channel stop doping is not presented in the FIGS. 32A-34D but like already stated they can be added to the process flow at suitable situation. The thin back illuminated device can be manufactured from the devices of FIGS. 32D, 33C and 34D for instance by grinding the back side of the bulk layer 103 or by manufacturing the devices of FIGS. 32D, 33C and 34D on a SOI wafer. The SOI wafer has two semiconductor layers and between them one isolator layer. After the other semiconductor surface is processed, the other side of the semiconductor wafer can be etched below the active area of the detector until the isolator layer is reached. After this the isolator layer may be etched away after which the back side of the processed semiconductor layer, i.e. of the bulk layer may be covered for instance with an antireflection coating.

The first conductivity type may be n type and the second conductivity type may be p type. The embodiments of FIGS. 11-34D and 44A-44C are applicable for both front and back illuminated detectors and any combination of them can be used. It is important to note that the embodiments and processes presented in FIGS. 11-34D and 44A-44C may also be used in the MIG detector presented by the documents PCT/FI2004/000492 and PCT/FI2005/000359 and having the conductive back side layer. The pixels may have any shape or form instead of the ones presented in FIGS. 11, 12 and 15. One can use instead of the double transistor pixels single transistor or multiple transistor pixels. The reading of the signal charge a number of times is, however, twice as fast in double transistor pixels as in single transistor pixels. Instead of the MOSFET, JFET and the BJT one can use any unipolar or bipolar transistor in the pixels. The source of a FET or the emitter of a bipolar transistor may be floating and it may be connected to a capacitor. The pixels may be surrounded by preferably ring shaped guard structures which are formed of MOS structures or of dopings in order to increase the pixel area. The dopings of the invention may also be tailored in any possible way using implants having different masks, different energies, different doses and different conductivity types. In some cases the dopings may also be replaced with suitable metal contacts, i.e. with Ohmic or Schottky type contacts. The semiconductor material is preferably silicon but any other semiconductor material may be used. The semiconductor material could for example be Germanium. The contact openings through the isolator layer 1307 and the contacts to the different dopings are not shown. The channel stop dopings are optional in the devices of FIGS. 7 and 8 and they may be floating. One can use anti reflection coatings, scintillator coatings or micro lenses in both front and back illuminated detectors.

The amount of signal charge in the MIG of a MIGFET can be obtained for instance by measuring the change in the threshold voltage, by measuring the change in the current running through the MIGFET or by measuring a the change in a voltage output over a known resistor the change of the voltage output corresponding to the change in the current running through the MIGFET. The amount of signal charge in the MIG of a MIGBJT can be obtained for instance by measuring the change of the emitter current or by measuring the change in a voltage output over a known resistor the change in the voltage output corresponding to the change in current running through the emitter, or by measuring the change in the base or emitter threshold. The base threshold is referred to as the base voltage at which the emitter current starts to run. The emitter threshold is referred to as the emitter voltage at which the emitter current starts to run. There are also other signal charge read out schemes and all the read out schemes may involve for instance capacitors, transistors, resistors etc.

It is important to note that the MIG enables very small amounts of signal charge to be detected. This can be achieved by making a measurement when there is signal charge in the MIG, by removing the signal charge from the MIG, by making a measurement when there is no signal charge, by subtracting the first measurement from the second measurement and doing this n times. As a result the read noise will be the read noise of one measurement divided by square root of n. This is, however, not the only method to detect small amounts of signal charges. One can also design the novel MIG detector (and the MIG detector) in such a way that with suitable operation voltage the signal charge transfer from the MIG and back to the MIG results in avalanche multiplication of the signal charge. This avalanche multiplication cycle can be performed n times after which the signal charge has multiplied to N×m^n where m is the avalanche multiplication gain of a single signal charge transfer. The first of the two methods enables a higher dynamic range. However, the two methods can also be combined, i.e. one can first perform the first method and after that the second method. The first method, i.e. the multiple read method is performed with lower applied bias voltages and the second method, i.e. the avalanche gain method is performed with higher applied bias voltages. Such a combined method has the same dynamic range than the multiple read method.

In the FIGS. 11, 12 and 15 presenting a group of four pixels the front surface or the back surface of the individual pixels can be covered by a colour filter and possibly with one or more micro lenses. The upper most and lowest pixel could for instance have a green colour filter and the left and the right pixel could have blue and a red colour filter respectively. The front or back surface of the detectors in the FIGS. 11, 12 and 15 can also be covered with a single colour filter possibly with micro lenses. In such case the light is preferably divided into three different components being for instance red, green and blue and preferably three separate chips are used in the camera. It should be noted that the invented detector should be designed such that there exists no neutral area in the barrier layer between the channel of a FET and the MIG layer and between the base of a BJT and the MIG layer since such a neutral area increases noise in the measurements. It should be also noted that all the FIGS. 1-35B are not to scale and that all the gates and metal layers presented in the FIGS. 1-35B can be formed of transparent conductors. It is also beneficial to use self aligned structures in order to reduce the misalignment of the masks. In stead of the square FETs one could also use circular FETs. The figures are not to scale and thus the area of the channel stop dopings can be much bigger than presented in the figures. There may also be additional layers in the device if they do not affect the operation principle of the MIG. Such additional layers can be for instance thin layers of semiconductor material of first or second conductivity type.

There may also be read and selection electronics on the detector chip. A device that includes a detector according to an embodiment of the invention may also include other semiconductor chips, some of which may have bonded connections to the pixels of the detector. This enables building very compact structures that include detection, amplification, reading and in some cases even storage in a very small space, like an MCM (multi-chip module).

Figure 36:
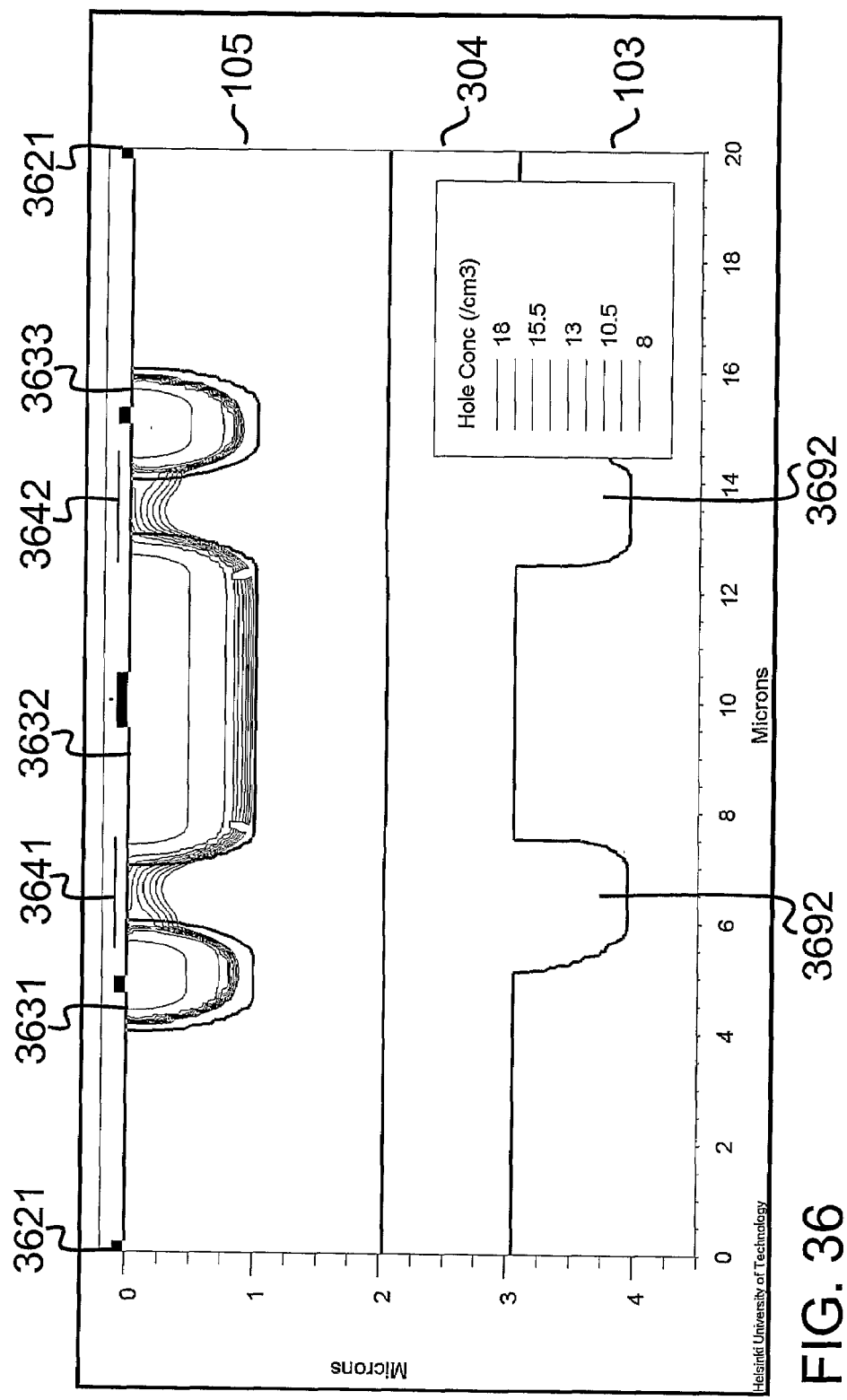
FIG. 36 illustrates simulated results.
Figure 37:
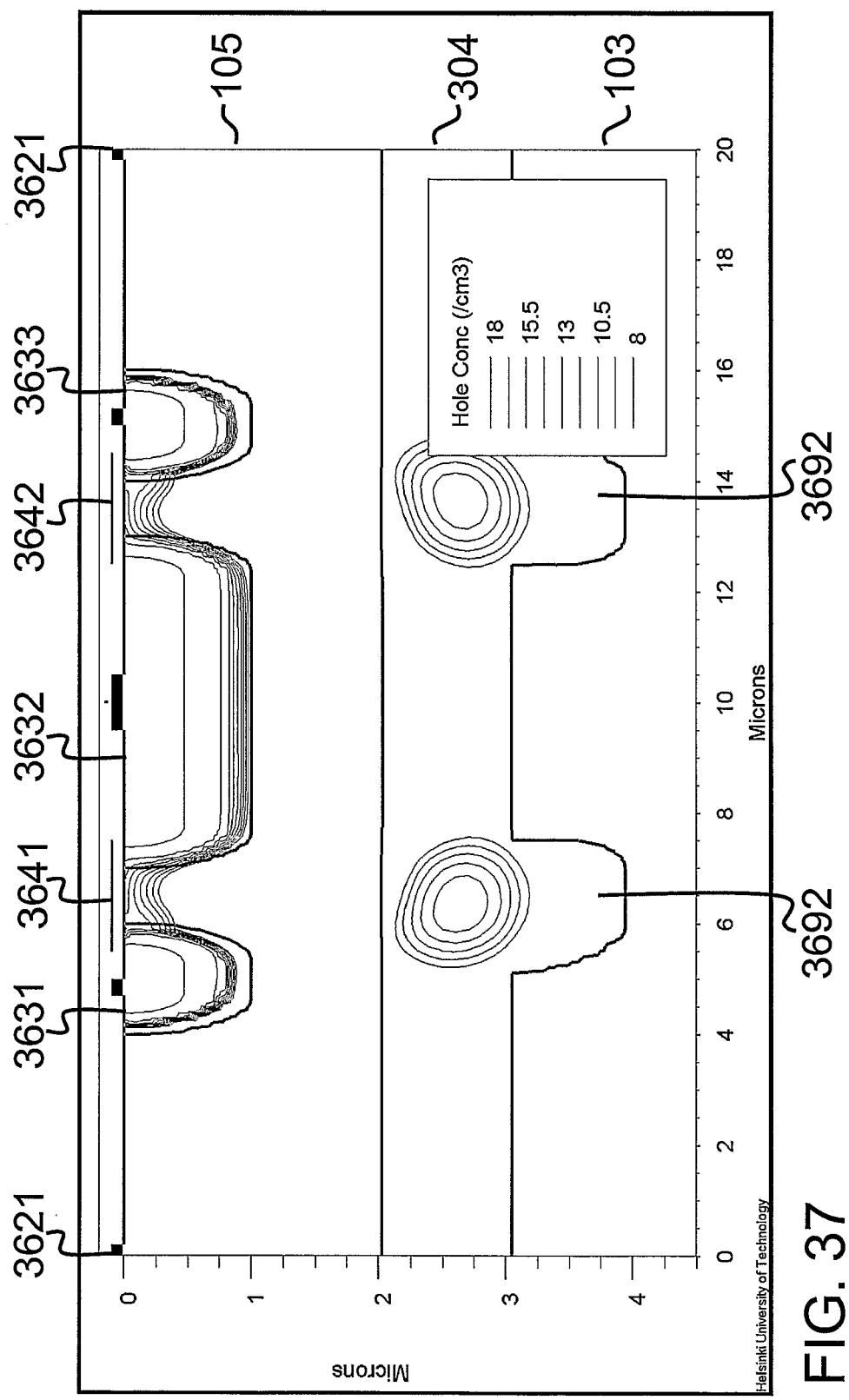
FIG. 37 illustrates simulated results.
Figure 38:
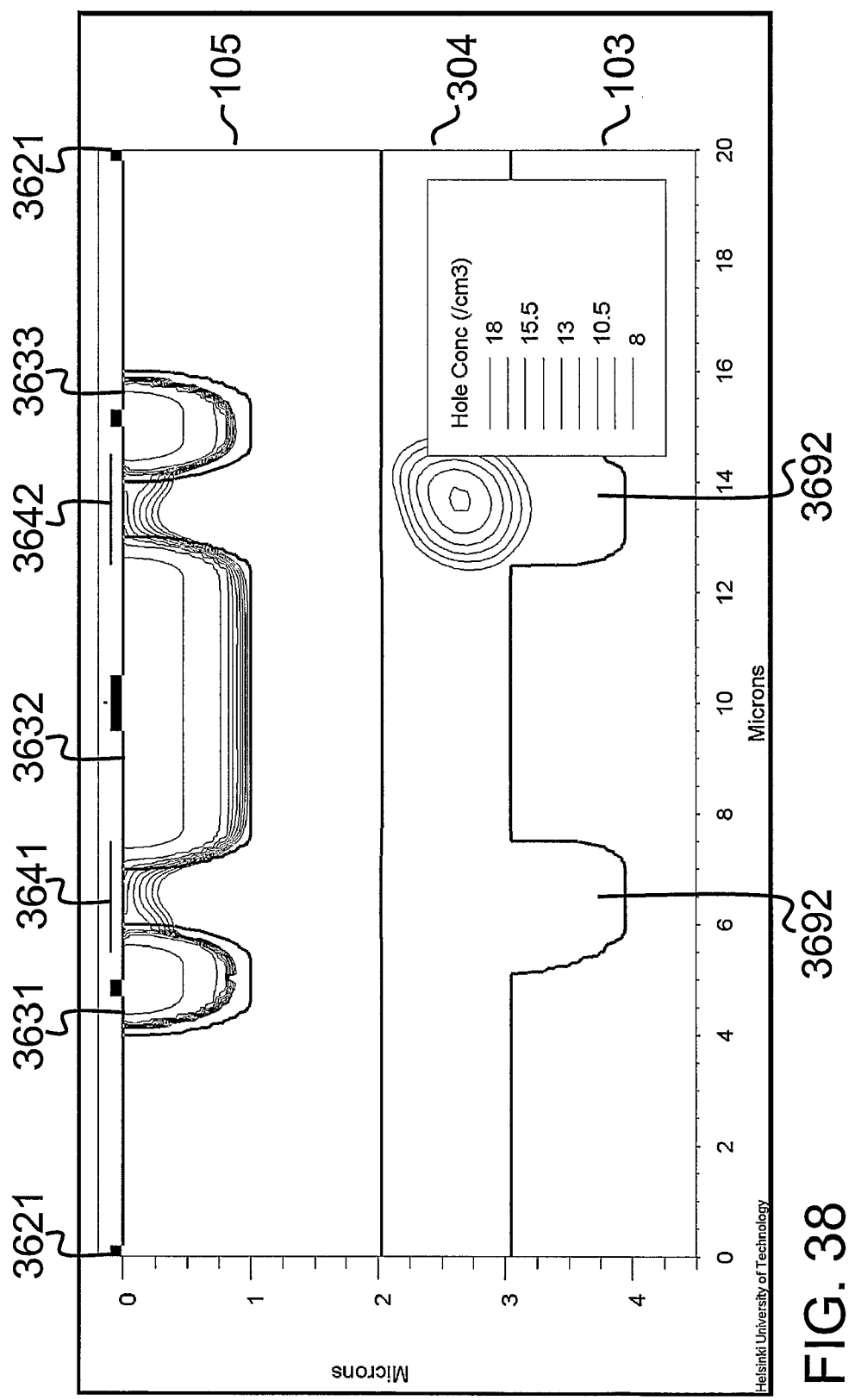
FIG. 38 illustrates simulated results.
Figure 39:
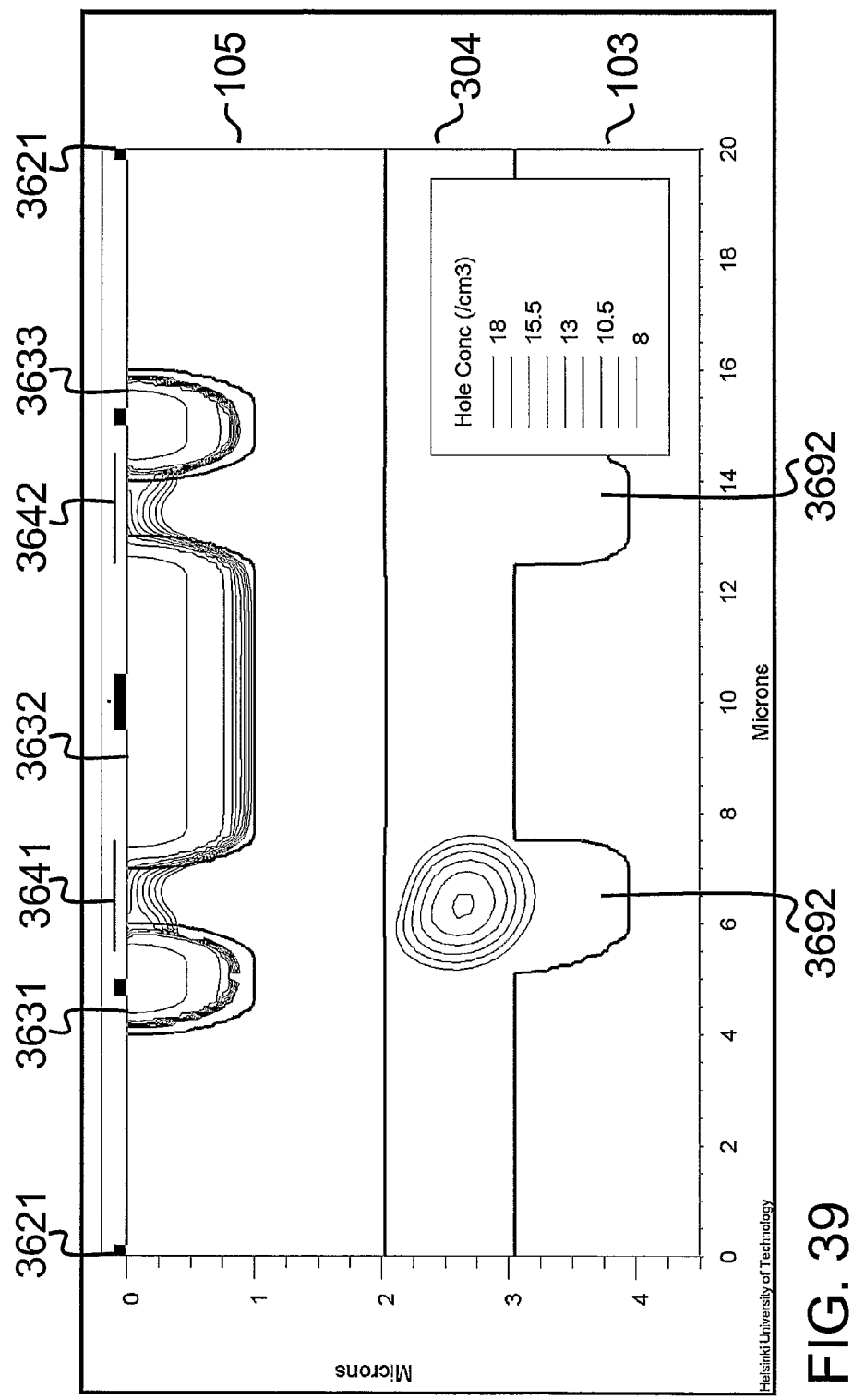
FIG. 39 illustrates simulated results.
Figure 40:
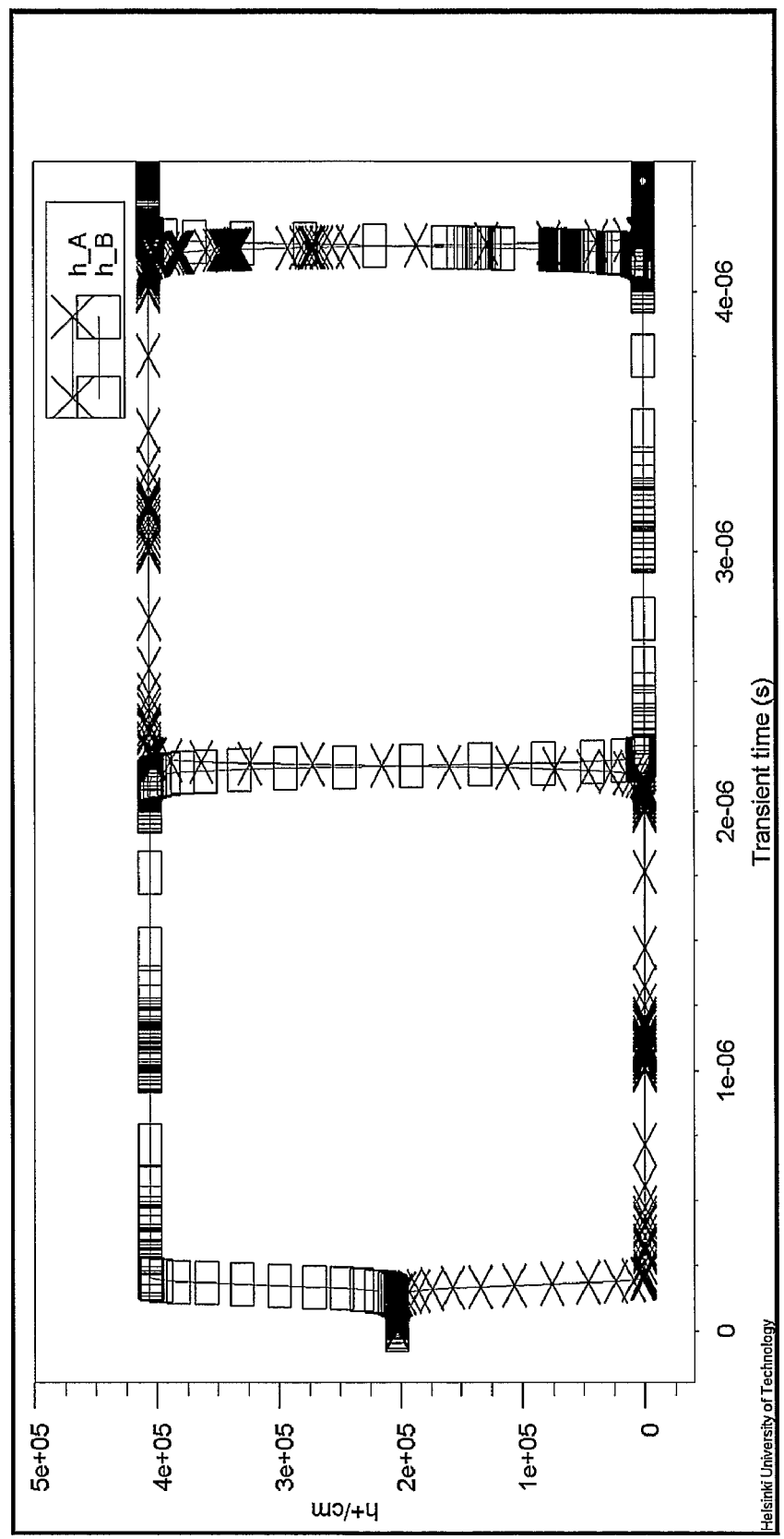
FIG. 40 illustrates simulated results.
Figure 41:
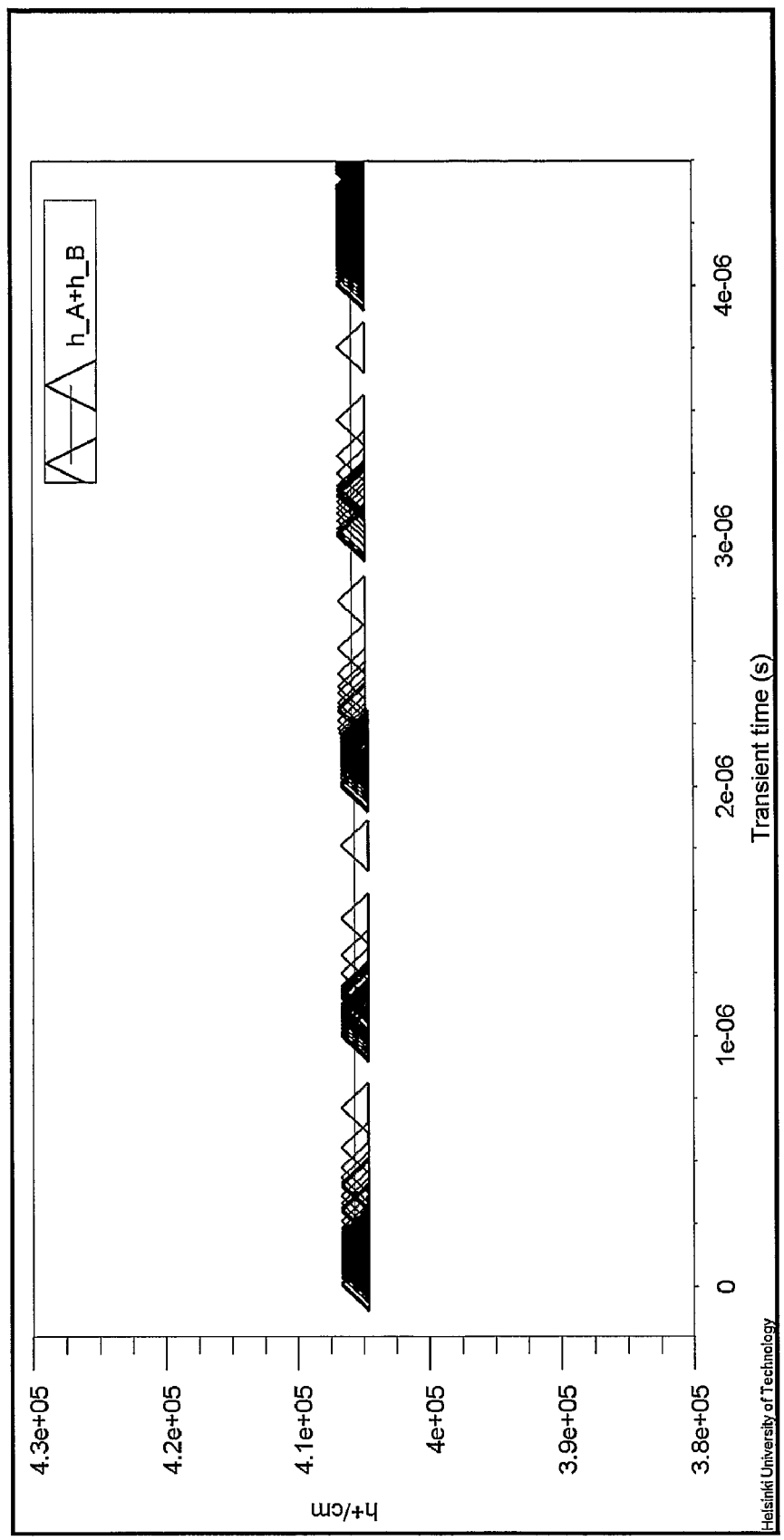
FIG. 41 illustrates simulated results.

The 2D simulation results of FIGS. 36-43 demonstrate the feasibility of the MIG detector concept. The FIG. 36 represents a MIG detector having a n type bulk layer 103, a p type MIG layer 104 and n type barrier layer 105. The p type pixel dopings 3631, 3632 and 3633 act as source/drain dopings, the gates 3641 and 3642 are used for measuring and transporting the signal charge and the channel stop contacts 3621 are used for signal charge clearing. The enhancement 3692 of the MIG layer doping collects the signal charges which are holes in this case. The situation showed in FIG. 36 is straight after the signal charge has been cleared by applying a clear voltage to channel stop contact. FIG. 37 shows the situation after some bulk generated holes are accumulated in the local enhancement of the MIG layer doping. In FIG. 38 all the holes in the left local enhancement of the MIG layer doping are shifted to the right local enhancement of the MIG layer doping by applying suitable voltage transients to the pixel dopings and to the gates. In FIG. 39 the holes in the right enhancement of MIG layer doping are transferred to the left enhancement of the MIG layer doping by the application of suitable voltage transients to the pixel dopings and to the gates. It is important to note that all the potentials in FIGS. 36-39 are the same; only the location of the holes is different. FIG. 40 shows the hole concentration in both local enhancements of the MIG layer dopings and FIG. 41 shows the combined hole concentration of the local enhancements of the MIG layer doping.

Figure 42:
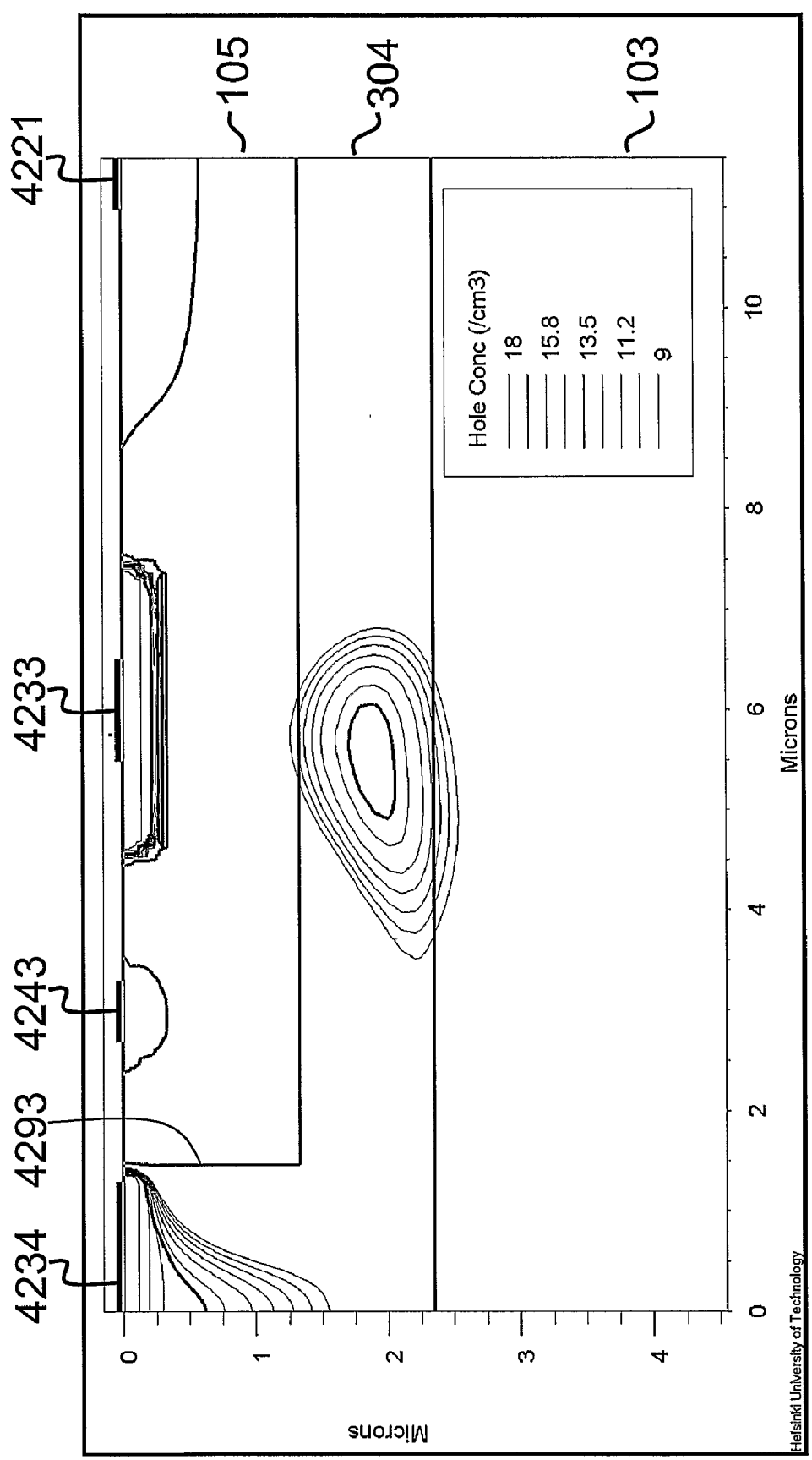
FIG. 42 illustrates simulated results.
Figure 43:
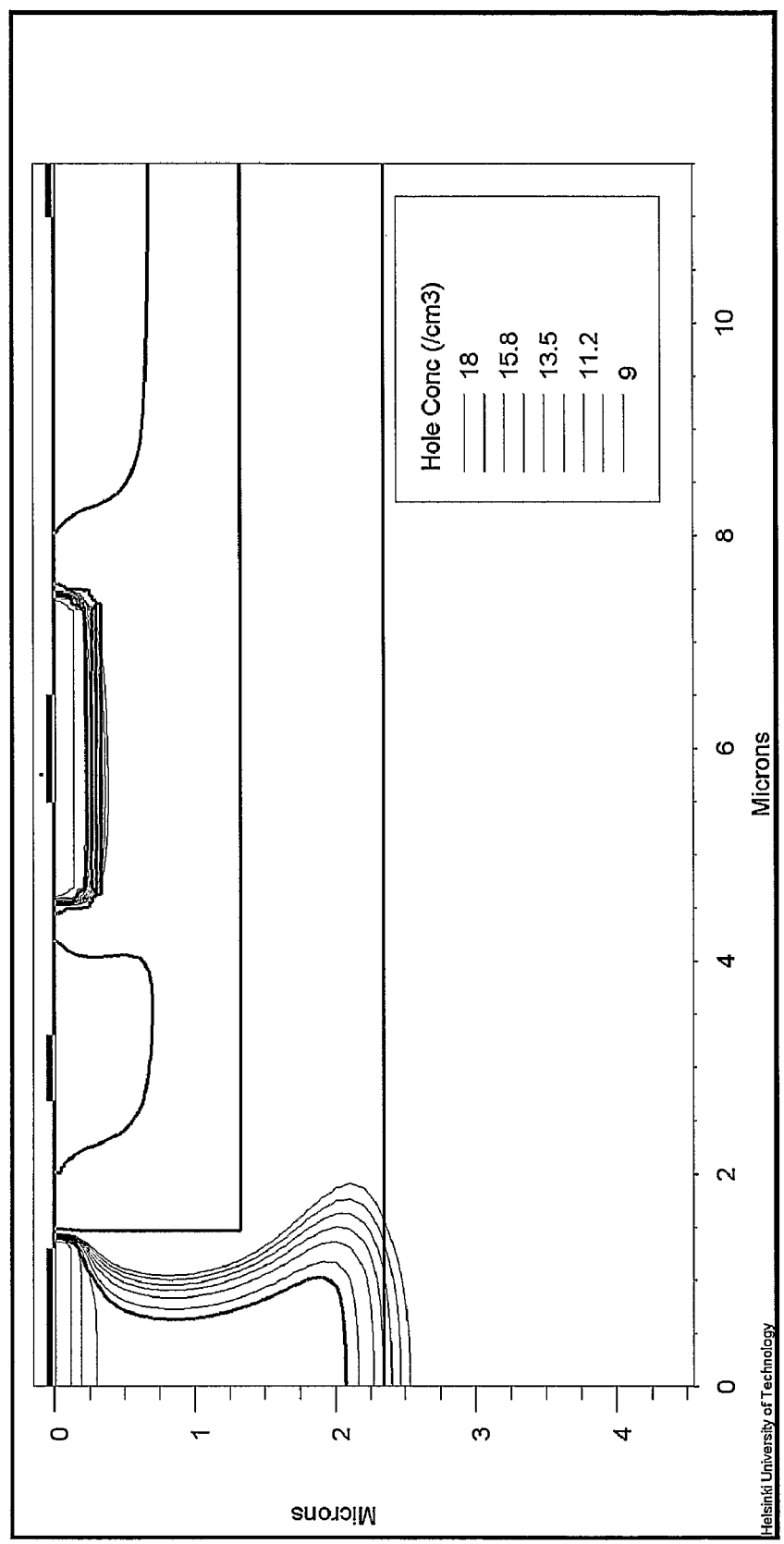
FIG. 43 illustrates simulated results.

In FIG. 42 the potentials of the p type pixel doping 4233, of the p type clear contact 4234, of the n type clear gate 4243 and of the n type doping 4221 are such that holes are accumulated in the MIG layer below the p type pixel doping 4233. In FIG. 43 the clear gate potential is changed and the holes can move freely from the MIG layer to the clear contact through the p type doping 4293. Besides the afore introduced effects the simulations have shown that the change in threshold voltage can be more than 100 μm.

The invention claimed is:

1. A semiconductor radiation detector device, comprising a bulk layer (103) of semiconductor material, and on a first surface of the bulk layer (103) in the following order:
a modified internal gate layer (104, 304) of semiconductor of second conductivity type,
a barrier layer (105) of semiconductor of first conductivity type and
pixel dopings (111, 112, 1331, 1332, 1333, 1334, 2206) of semiconductor of the second conductivity type, adapted to be coupled to at least one pixel voltage in order to create pixels corresponding to pixel dopings, characterised in that:
the device comprises a first conductivity type first contact, said pixel voltage being defined as a potential difference between the pixel doping and the first contact, and
the bulk layer (103) is of the first conductivity type.

2. A semiconductor radiation detector device according to claim 1, wherein a number of pixel dopings (111, 112, 1331, 1332, 1333, 1334, 2206) comprise a pixel-specific transistor built on the pixel doping, said transistor being a field effect transistor or bipolar transistor, and the semiconductor radiation detector device comprises a signal charge reader circuit adapted to measure electric characteristics of pixel-specific transistors related to effective channel or base dimensions of the pixel-specific transistors.

3. A semiconductor radiation detector device according to claim 2, wherein said signal charge reader circuit is adapted to measure electric characteristics of a pixel-specific transistor related to decreasing channel or base width caused by radiation-induced holes or electrons accumulating in the modified internal gate layer at a location coincident with a pixel containing said pixel-specific transistor.

4. A semiconductor radiation detector device according to claim 3, comprising a channel stop area between pixels.

5. A semiconductor radiation detector device according to claim 2, wherein said signal charge reader circuit is adapted to measure electric characteristics of a pixel-specific transistor related to increasing channel or base width caused by radiation-induced electrons or holes accumulating in the modified internal gate layer at a location coincident with a pixel containing said pixel-specific transistor.

6. A semiconductor radiation detector device according to claim 5, comprising a channel stop area between pixels.

7. A semiconductor radiation detector device according to claim 2, comprising a channel stop area-between pixels.

8. A semiconductor radiation detector device according to claim 1, comprising a channel stop area between pixels.

9. A semiconductor radiation detector device according to claim 8, wherein said channel stop area comprises dopings (121, 122, 1121, 1221, 1521, 1721) of the first conductivity type, thus exhibiting the opposite type of conductivity compared to the pixels.

10. A semiconductor radiation detector device according to claim 9, wherein the channel stop dopings between pixels correspond to the first contact.

11. A semiconductor radiation detector device according to claim 10, wherein the secondary charges that are generated in bulk layer are collected by the channel stop dopings.

12. A semiconductor radiation detector device according to claim 11, wherein the bulk layer is thinned from the second surface and the semiconductor radiation detector device is illuminated from the back surface (102).

13. A semiconductor radiation detector device according to claim 8, wherein the ratio of the channel stop area of one pixel to the total pixel area is at least 0.3.

14. A semiconductor radiation detector device according to claim 1, wherein the first contact (725) is on the back surface (102) of the detector, or outside the active area on the front surface (101) of the detector, or on the edge (700) of the detector chip.

15. A semiconductor radiation detector device according to claim 14, wherein the secondary charges that are generated in the bulk layer are collected by the first contact (725).

16. A semiconductor radiation detector device according to claim 1, wherein there is in the barrier layer (105) of the first conductivity type a doped region (1393) of the second conductivity type or a local reduction (3396) of the barrier layer net doping between the modified internal gate layer (104) of second conductivity type and a pixel doping (1334, 1434, 1634, 3334) of second conductivity type or wherein there is a trench (1334, 1393, 1494, 1695) between the modified internal gate layer (104) and the front surface of the detector.

17. A semiconductor radiation detector device according to claim 1 wherein the detector is illuminated from the first surface.

18. A semiconductor radiation detector device according to claim 16, wherein the ratio of the net doping concentration in the first conductivity type local reduction of the barrier layer doping to the net doping concentration in the first conductivity type barrier layer doping without the local reduction of the barrier layer doping is less than 0.9.

19. A semiconductor radiation detector device according to claim 16, wherein a gate (1343, 1443, 1643, 1695) is adapted to control the flow of signal charges from the modified internal gate layer (104) to the pixel doping (1334, 1434, 1634, 3334) or to the front surface of the detector through the doped region (1393) of second conductivity type, through the local reduction (3396) of the barrier layer net doping, or through the trench (1334, 1393, 1494, 1695).

20. A semiconductor radiation detector device according to claim 19, wherein the gate is formed of a doping of first conductivity type (1443).

21. A semiconductor radiation detector device according to claim 19, wherein the gate is formed of a MOS structure (1343, 1643).

22. A semiconductor radiation detector device according to claim 19, wherein the ratio of the net doping concentration in the first conductivity type local reduction of the barrier layer doping to the net doping concentration in the first conductivity type barrier layer doping without the local reduction of the barrier layer doping is less than 0.9.

23. A semiconductor radiation detector device according to claim 1, wherein a region (1726) of first conductivity type or a trench structure (1727, 1728) penetrates through the modified internal gate layer of second conductivity type in order to improve the collection of the secondary charges from the bulk layer 103.

24. A semiconductor radiation detector device according to claim 1, comprising structures (1771, 1772, 1773, 1774, 1775, 1776, 1777) improving the separation of the signal and surface generated charges.

25. A semiconductor radiation detector device according to claim 1, wherein the modified internal gate layer is discontinuous.

26. A semiconductor radiation detector device according to claim 1 comprising a layer of semiconductor (808) material of first or second conductivity type between the bulk layer and the modified internal gate layer.

27. A semiconductor radiation detector device according to claim 1, comprising at least one of the following: an alteration (1929) of the bather layer doping, a gap in the modified internal gate layer doping (1991, 1591), an enhancement (1392) of the modified internal gate layer doping, an alteration in the bulk layer doping next to the MIG layer in order to improve the signal charge transporting potential gradient in the MIG layer.

28. A semiconductor radiation detector device according to claim 1, comprising a local enhancement (1392) of the modified internal gate layer doping under the gate of a field effect transistor or under the emitter of a bipolar junction transistor in order to improve the dynamic range of the detector.

29. A semiconductor radiation detector device according to claim 1, wherein the channel of a field effect transistor below the gate of the field effect transistor is depleted and wherein a pulse of signal charges generated by radiation and entering the modified internal gate is detected as a current pulse in the gate.

30. A method for detecting radiation, comprising:
coupling a number of pixels (111, 112, 113, 114) on a surface of a semiconductor radiation detector device to a pixel voltage, and
illuminating said semiconductor radiation detector with radiation; characterised in that it comprises:
collecting radiation-induced signal charges of first kind from a bulk layer (103), from a modified internal gate layer and from a barrier layer of said semiconductor radiation detector to local minima (412) of a three-dimensional potential function for said charges of first kind, said local minima being locationally coincident with pixels (111) in a modified internal gate layer (104, 304) situated next to said bulk layer (103), and
detecting the amount of signal charge collected to local minima that coincide with pixels (111).

31. A method according to claim 30, wherein detecting the amount of signal charge comprises observing the electric characteristics of pixel-specific transistors related to effective channel or base dimensions of the pixel-specific transistors.

32. A method according to claim 31, wherein detecting the amount of signal charge comprises observing the electric characteristics of pixel-specific transistors related to decreasing channel or base dimensions of the pixel-specific transistors.

33. A method according to claim 32, wherein detecting the amount of signal charge comprises observing the electric characteristics of pixel-specific transistors related to increasing channel or base dimensions of the pixel-specific transistors.

34. A method according to claim 33, wherein detecting the amount of signal charge comprises transferring pixel-related charge across a number of pixels to a readout pixel, and observing the electric characteristics of said readout pixel.

* * * * *